(12) United States Patent
Ode et al.

(10) Patent No.: US 6,864,745 B2
(45) Date of Patent: Mar. 8, 2005

(54) DISTORTION COMPENSATION DEVICE

(75) Inventors: Takayoshi Ode, Kawasaki (JP); Yasuyuki Oishi, Kawasaki (JP); Tokuro Kubo, Kawasaki (JP); Kazuo Nagatani, Kawasaki (JP); Hajime Hamada, Kawasaki (JP); Hiroyoshi Ishikawa, Kawasaki (JP); Nobukazu Fudaba, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/687,391

(22) Filed: Oct. 15, 2003

(65) Prior Publication Data

US 2004/0212428 A1 Oct. 28, 2004

Related U.S. Application Data

(63) Continuation of application No. PCT/JP01/03297, filed on Apr. 18, 2001.

(51) Int. Cl.$^7$ ................................................. H03F 1/26
(52) U.S. Cl. ..................................... 330/149; 330/136
(58) Field of Search ........................... 330/2, 107, 129, 330/136, 149

(56) References Cited

U.S. PATENT DOCUMENTS 5,892,397 A * 4/1999 Belcher et al. ............. 330/149
6,717,464 B2 * 4/2004 Fudaba et al. .............. 330/149

FOREIGN PATENT DOCUMENTS

| JP | 8-242263 | 9/1996 |
| JP | 9-69863 | 3/1997 |
| JP | 9-83417 | 3/1997 |
| WO | WO 93/18581 | 9/1993 |

* cited by examiner

Primary Examiner—Steven J. Mottola
(74) Attorney, Agent, or Firm—Katten Muchin Zavis Rosenman

(57) ABSTRACT

In a distortion compensation device which uses distortion compensation coefficients to subject distortion compensation processing to an input signal and supply the result of the distortion compensation processing to a distorting device, calculates the distortion compensation coefficients based on the input signal before distortion compensation and the feedback signal fed back from the output side of the distorting device, and stores the calculated distortion compensation coefficients in association with the input signal, (1) the feedback signal is AD-converted; (2) the AD-converted output is subjected to fast Fourier transform (FFT) processing; (3) the FFT calculation result is used to calculate the value of either the signal-to-noise ratio SNR, or the adjacent channel leakage power ratio ACLR, or the noise level; (4) the delay time occurring in the distorting device and feedback loop is adjusted such that the difference between the above calculated value at the current time and the above calculated value at the immediately preceding time is either zero, or is equal to or less than a threshold value; and, (5) this adjustment processing is repeated to determine the accurate delay time, and based on this delay time the timing of each of the portions of the distortion compensation device is adjusted.

17 Claims, 28 Drawing Sheets

— DELAY AMOUNT D1
— — DELAY AMOUNT D2

FIG. 23
(a)
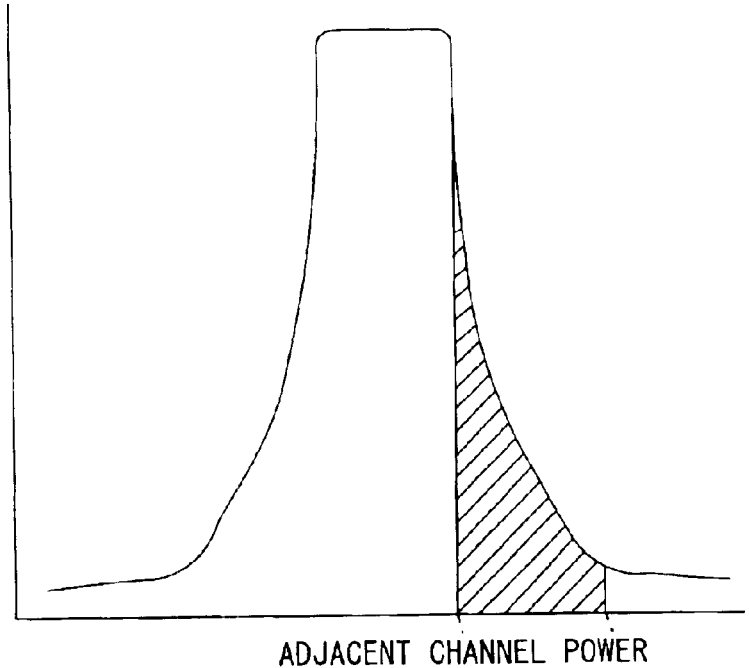
ADJACENT CHANNEL POWER
(b) INSERTION LOSS
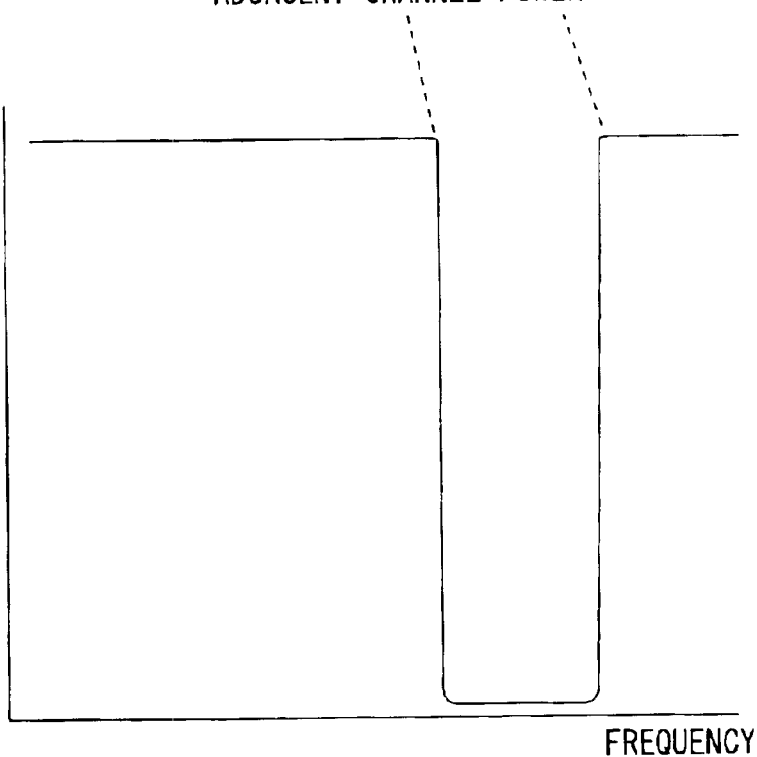
FREQUENCY
EXAMPLE OF BAND-PASS FILTER
FREQUENCY CHARACTERISTIC

FIG. 26
PRIOR ART
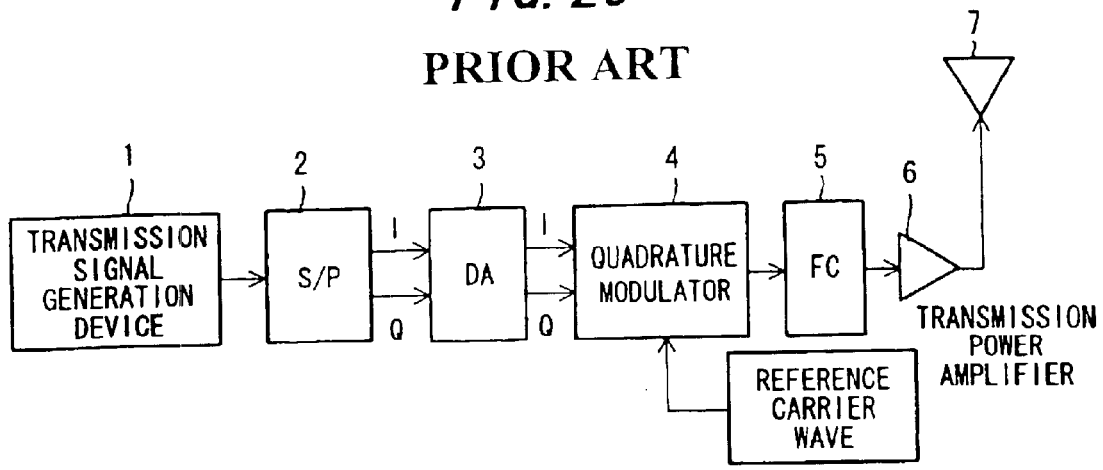
FIG. 27
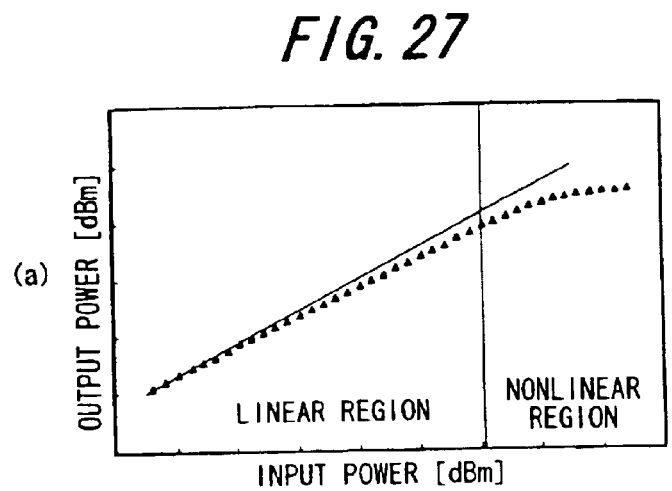
(a)
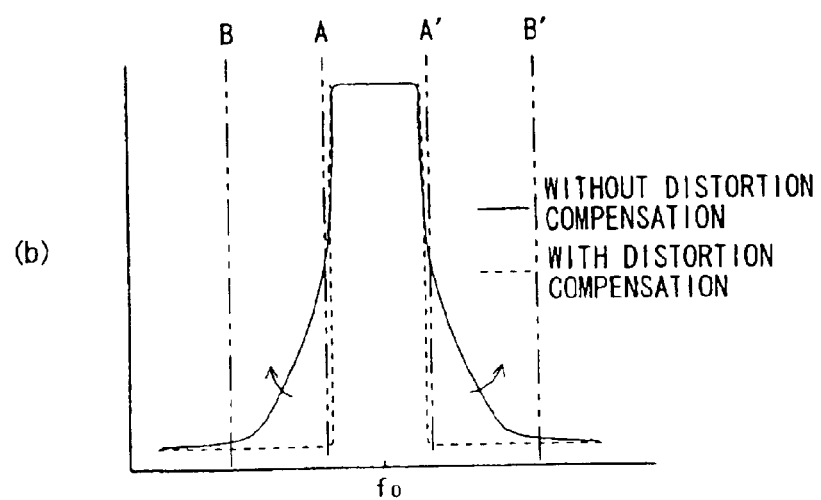
(b)

US 6,864,745 B2

DISTORTION COMPENSATION DEVICE

CROSS-REFERENCE TO RELATED APPLICATION

The present application is a continuation of International Application No. PCT/JP01/03297 which was filed on Apr. 18, 2001.

BACKGROUND OF THE INVENTION

This invention relates to a distortion compensation device, and in particular a distortion compensation device comprising a function which determines the delay time occurring in the feedback loop with the power amplifier from the SNR (signal-to-noise ratio), the ACLR (adjacent channel power ratio), the noise level Pn or similar, and based on the delay time controls the timing within each portion of the distortion compensation device.

In recent years bandwidth resources have become restricted, and there has been widespread adoption of highly efficient digital transmission in wireless communications. When employing multivalued phase modulation methods to wireless communication, techniques to linearize the amplification characteristics of the transmitting side and particularly the power amplifier to suppress nonlinear distortion, and to reduce adjacent channel leakage power, are important; further, when using amplifiers with poor linearity to improve power efficiency, techniques to compensate for the occurrence of distortion arising therefrom are essential.

FIG. 26 is a block diagram showing one example of a transmission device in conventional wireless equipment; the transmission signal generation device 1 transmits a serial digital data stream, and the serial/parallel converter (S/P converter) 2 converts the digital data stream into two series, which are an in-phase component (I signal) and quadrature component (Q signal), distributing alternating bits. The DA converter 3 converts the I signal and Q signal into analog baseband signals, for input to the quadrature modulator 4. The quadrature modulator multiplies the input I and Q signals (transmission baseband signals) by the reference carrier and a signal phase-shifted 90° from this, respectively, and adds the multiplied results to perform quadrature conversion for output. The frequency converter 5 mixes the quadrature-modulated signal and the local oscillation signal to perform frequency conversion, and the transmission power amplifier 6 amplifies and radiates through the air, from an aerial wire (antenna) 7, the carrier wave output from the frequency converter 5.

In W-CDMA, PDC (Personal Digital Cellular) and other mobile communications, the transmission power of the transmission device is high, ranging from 10 mW to several tens of watts, and the input/output characteristic (distortion function f(p)) of the transmission power amplifier 6 are nonlinear, as indicated by the dashed line in (a) in FIG. 27. Nonlinear distortion occurs due to this nonlinear characteristic, and the frequency spectrum in the vicinity of the transmission frequency $f_0$ has lifted side lobes, as indicated by the solid line in (b) in FIG. 27, so that leakage into adjacent channels and adjacent channel interference occur. That is, due to nonlinear distortion, the power leaked by the transmission wave into adjacent frequency channels is large as shown in (b). The leakage power is explained as the ACLR (Adjacent Channel Leakage Ratio), but normally is the same as the ACPR (Adjacent Channel Power Ratio). The ACLR is the ratio of the power of the channel in question, which is the area of the spectrum between the dot-dash line A and the dot-dash line A' in (b) of FIG. 27, to the adjacent leakage power which is the area of the leakage spectrum in the adjacent channels between the two dot-dash lines B, B'. This leakage power is noise with respect to other channels, and causes degradation of the communication quality of these channels. Hence it must be strictly regulated.

The leakage power is for example low in the linear region of the power amplifier (see (a) in FIG. 27), and increases in the nonlinear region. In order to enable use as a high-output transmission power amplifier, the linear region must be broadened. However, in order to achieve this an amplifier is required with capacity equal to or greater than that actually required, so that there are problems of disadvantageous cost and device size.

Further, in normal amplifiers the power added efficiency in the linear region is low, as seen in FIG. 28, and is large in the nonlinear region. Here the "power added efficiency" is the ratio of the difference in the input power Pin and output power Pout (Pin-Pout) to the rated power of the amplifier (expressed in percent), and is the portion which becomes heat. Thus in order to obtain the required transmission power, a large power consumption is necessary in the nonlinear region, and yet as described above, distortion increases and the ACLR is degraded. In such circumstances, a wireless device with a distortion compensation function (a linearizer) compensates for distortion in the transmission power and enables use of the amplifier in the region with good power added efficiency.

FIG. 29 is a block diagram of a transmission device comprising a digital nonlinear distortion compensation function using a DSP. The digital data group (transmission signal) transmitted from the transmission signal generation device 1 is converted into two series, an I signal and a Q signal, in the S/P converter 2, and these are input to the distortion compensation portion 8 comprising a DSP. As shown functionally in FIG. 30, the distortion compensation portion 8 comprises a distortion compensation coefficient storage portion 8a, which stores distortion compensation coefficients h(pi) (i=0 to 1023) according to the power levels 0 to 1023 of the transmission signal x(t), a predistortion portion 8b which performs distortion compensation processing (predistortion) of the transmission signal using the distortion compensation coefficients h(pi) according to the transmission signal level, and a distortion compensation coefficient calculation portion 8c which compares the transmission signal x(t) with a demodulation signal (feedback signal) y(t) demodulated by a quadrature detector, described below, calculates the distortion compensation coefficients h(pi) such that the difference is zero, and performs updating.

The distortion compensation portion 8 uses the distortion compensation coefficients h(pi) according to the power level of the transmission signal x(t) to perform predistortion processing of the transmission signal, and inputs the result to the DA converter 3. The DA converter 3 converts the input I signal and Q signal into analog baseband signals, and inputs the result to the quadrature modulator 4. The quadrature modulator 4 multiplies the I signal and Q signal thus input by the reference carrier wave and by the signal obtained by phase-shifting this reference carrier wave by 90°, respectively, and by adding the multiplication results performs quadrature conversion for output. The frequency converter 5 mixes the quadrature modulated signal and the local oscillation signal to perform frequency conversion, and the transmission power amplifier 6 power-amplifies the carrier wave signal output from the frequency converter 5, and radiates the result through the air, from an aerial wire (antenna) 7.

A portion of the transmission signal is input to the frequency converter 10 via a directional coupler 9, and is frequency-converted and input to the quadrature detector 11. The quadrature detector 11 multiplies the input signals by the reference carrier wave and by the signal resulting from 90° phase-shifting of the carrier wave respectively to perform quadrature detection, and the baseband I and Q signals are reproduced on the transmission side and input to the AD converter 12. The AD converter 12 converts the I and Q signals input into digital signals, which are input to the distortion compensation portion 8. The distortion compensation portion 8 uses the LMS (least-mean-square) algorithm in adaptive signal processing to compare the transmission signal prior to distortion compensation with the feedback signal resulting from demodulation by the quadrature detector 11, and calculates and updates the distortion compensation coefficients h(pi) such that the difference is zero. Then, the distortion compensation coefficients updated for the transmission signal to be transmitted next are used to perform predistortion processing and output. Subsequently the above-described operation is repeated, so that the nonlinear distortion of the transmission power amplifier 6 is suppressed and adjacent-channel leakage power is reduced.

FIG. 31 is an explanatory diagram of distortion compensation processing using an adaptive LMS algorithm. 15*a* is a multiplier (corresponding to the predistortion portion 8*b* in FIG. 30) which multiplies the transmission signal x(t) by the distortion compensation coefficients $h_{n-1}(p)$, 15*b* is a transmission power amplifier having a distortion function f(p), 15*c* is a feedback system which feeds back the output signal y(t) from the transmission power amplifier, 15*d* is a calculation portion (amplitude-power conversion portion) which calculates the power p $(=x(t)^2)$ of the transmission signal x(t), and 15*e* is a distortion compensation coefficient storage portion (corresponding to the distortion compensation coefficient storage portion 8*a* in FIG. 30) which stores distortion compensation coefficients for different power levels of the transmission signal x(t); distortion compensation coefficients $h_{n-1}(p)$ are output according to the power p of the transmission signal x(t), and in addition the distortion compensation coefficients $h_{n-1}(p)$ are updated with the distortion compensation coefficients $h_n(p)$ determined by the LMS algorithm.

15*f* is a complex conjugate signal output portion, 15*g* is a subtracter which outputs the difference e(t) between the transmission signal x(t) and the feedback demodulation signal y(t), 15*h* is a multiplier which performs multiplication of e(t) and u*(t), 15*i* is a multiplier which performs multiplication of $h_{n-1}(p)$ and y*(t), 15*j* is a multiplier which multiplies the step size parameter R, 15*k* is an adder which adds $h_{n-1}(p)$ and Re(t)u*(t), and 15*m*, 15*n*, and 15*p* are delay portions, which append to the input signal the delay time from the input of the transmission signal x(t) until the feedback demodulation signal y(t) is input to the subtracter 15*g*. 15*f* and 15*h* through 15*j* constitute a rotation calculation portion 16. u(t) is the signal receiving the distortion. As a result of the above configuration, the following calculations are performed.

$$h_n(p)=h_{n-1}(p)+\mu e(t)u^*(t)$$

$$e(t)=x(t)-y(t)$$

$$y(t)=h_{n-1}(p)x(t)f(p)$$

$$u(t)=x(t)f(p)=h^*_{n-1}(p)y(t)$$

$$P=|x(t)|^2$$

Here x, y, f, h, u, e are complex numbers, and * indicates the complex conjugate. By performing the above-described calculations, distortion compensation coefficients h(p) are updated such that the difference e(t) between the transmission signal x(t) and the feedback demodulation signal y(t) is minimum, so that ultimately there is convergence on the optimum distortion compensation coefficient values, and the distortion of the transmission power amplifier is compensated.

FIG. 32 shows the overall configuration of a transmission device represented as x(t)=I(t)+jQ(t); portions which are the same as in FIG. 29 and FIG. 31 are assigned the same symbols.

As described above, the principle of digital nonlinear distortion compensation methods involves feedback detection of the carrier wave obtained by quadrature modulation, digital conversion and comparison of the transmission signal and feedback signal, and realtime updating of the distortion compensation coefficients based on the comparison results. By means of this nonlinear distortion compensation method, distortion can be reduced, and consequently leakage power can be kept low even at high-output operation in the nonlinear range; in addition, the power added efficiency can be improved.

However, if the delay time in the transmission power amplifier 15*b* is $D_0$ and the delay time in the feedback amplifier 15*c* is $D_1$, then the delay time D set in each of the delay circuits 15*m*, 15*n*, 15*p* of the distortion compensation device must be set so as to satisfy the equation:

$$D=D_0+D_1$$

If this delay time D cannot be correctly set, the distortion compensation function will not operate effectively, and the larger the error of the delay time setting, the greater the swelling of the side lobes, and the more pronounced the power leakage into adjacent channels.

There are individual differences and changes with aging in the filters and other devices used in the power amplifier 15*b* and feedback system 15*c*, so that the overall delay time D fluctuates. Consequently the delay times set in the delay circuits 15*m*, 15*n*, 15*p* for each conventional transmission device are adjusted manually using delay time adjustment switches or similar, and so the task of adjusting delay times is complex, and there is the further problem that precise adjustments cannot be made.

SUMMARY OF THE INVENTION

In light of the above, an object of this invention is to automatically determine delay times with high precision, and enable the delay times to be set in delay circuits.

Another object of this invention is to enable satisfactory distortion compensation by using accurate delay times, and moreover to enable improvement of the power added efficiency of the transmission power amplifier and reduction of power consumption.

Still another object of this invention is to improve the power added efficiency and lessen heat generation, and by this means to curtail heat generation remedies and reducing the scale of the device.

A first invention is a distortion compensation device, in which distortion compensation coefficients are used to perform distortion compensation processing of an input signal, which is input to a distorting device, distortion compensation coefficients are calculated based on the input signal prior to distortion compensation and on the feedback signal which is fed back from the output of the distorting device, and the distortion compensation coefficients thus calculated are stored in correspondence with the input signal, wherein (1) the feedback signal is AD converted; (2) the AD converted output is subjected to fast Fourier transform (FFT) processing; (3) the FFT calculation result is used to calculate either the signal-to-noise ratio SNR, or the adjacent-channel leakage power ratio ACLR, or the noise level Pn; (4) the delay time occurring in the distorting device and feedback loop is adjusted such that the difference between the above-described calculated values at the current moment and the above-described calculated values at the previous moment is zero or is below a threshold; and, (5) this adjustment process is repeated to determine the accurate delay time, and based on this delay time, the timing of each portion of the distortion compensation device is coordinated.

A second invention is a distortion compensation device, in which distortion compensation coefficients are used to perform distortion compensation processing of an input signal, which is input to a distorting device, distortion compensation coefficients are calculated based on the input signal prior to distortion compensation and on the feedback signal which is fed back from the output of the distorting device, and the distortion compensation coefficients thus calculated are stored in correspondence with the input signal, wherein (1) the feedback signal is AD converted; (2) the AD converted output is subjected to fast Fourier transform (FFT) processing; (3) based on the FFT calculation result, either the signal-to-noise ratio SNR, or the adjacent-channel leakage power ratio ACLR, or the noise level Pn is calculated; and, (4) the AD conversion portion clock timing is adjusted such that the difference between the above-described calculated values at the current moment and the above-described calculated values at the previous moment is zero or is below a threshold.

A third invention is a distortion compensation device, in which distortion compensation coefficients are used to perform distortion compensation processing of an input signal, which is input to a distorting device, distortion compensation coefficients are calculated based on the input signal prior to distortion compensation and on the feedback signal which is fed back from the output of the distorting device, and the distortion compensation coefficients thus calculated are stored in correspondence with the input signal, wherein (1) a band-pass filter is provided, the pass band of which is at least the frequency band of adjacent channels, and to which the above feedback signal is input; (2) the noise power, including the power of adjacent channels, is detected from the output of the band-pass filter; (3) the delay time occurring in the distorting device and feedback loop is adjusted such that the difference between the noise power at the current moment and the noise power at the previous moment is zero or is below a threshold; and, (4) this adjustment processing is repeated to determine the accurate delay time, and based on this delay time, the timing of each portion of the distortion compensation device is coordinated.

By means of the above first through third inventions, the timing of the transmission signal and feedback signal in the distortion compensation device can be coordinated automatically and precisely, so that the precision of distortion compensation can be improved, and moreover stable operation of distortion compensation is possible. Further, the power added efficiency of the transmission power amplifier can be improved, and power consumption can be reduced. Also, by improving the power added efficiency, heat generation can be diminished, and heat generation remedies can be curtailed, as a result of which the device scale can be reduced.

BRIEF DESCRIPTION OF THE DRAWINGS

FIG. 23 explains the band pass characteristic of a band-pass filter;

FIG. 26 is a drawing of the configuration of a conventional transmission device;

FIG. 27 is a drawing explaining a problem due to non-linearity of the transmission power amplifier;

DESCRIPTION OF THE PREFERRED EMBODIMENTS

(A) Principle of this Invention

Figure 1:
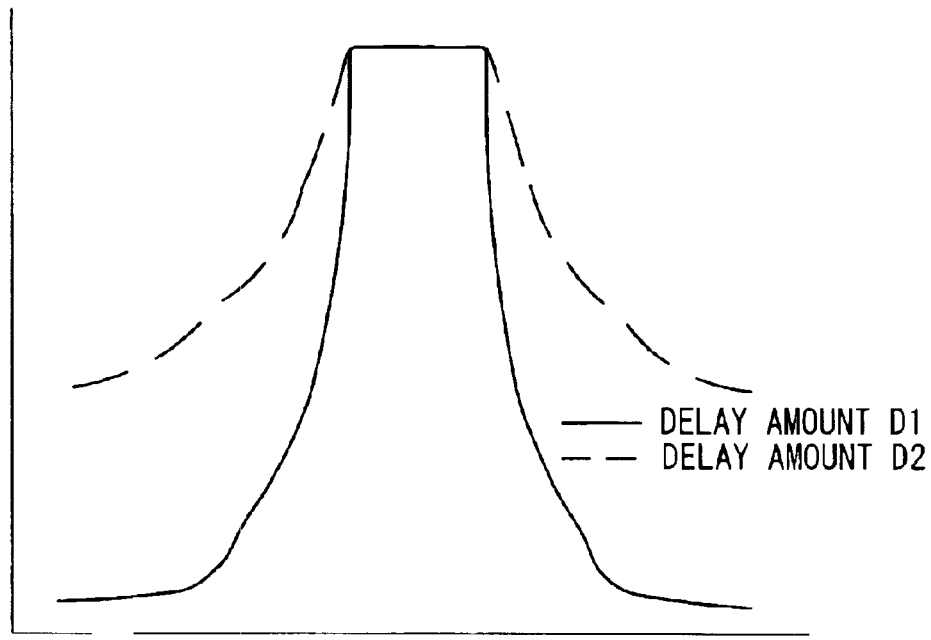
FIG. 1 is a drawing explaining the relation between delay time and adjacent channel leakage power ACLR.
Figure 31:
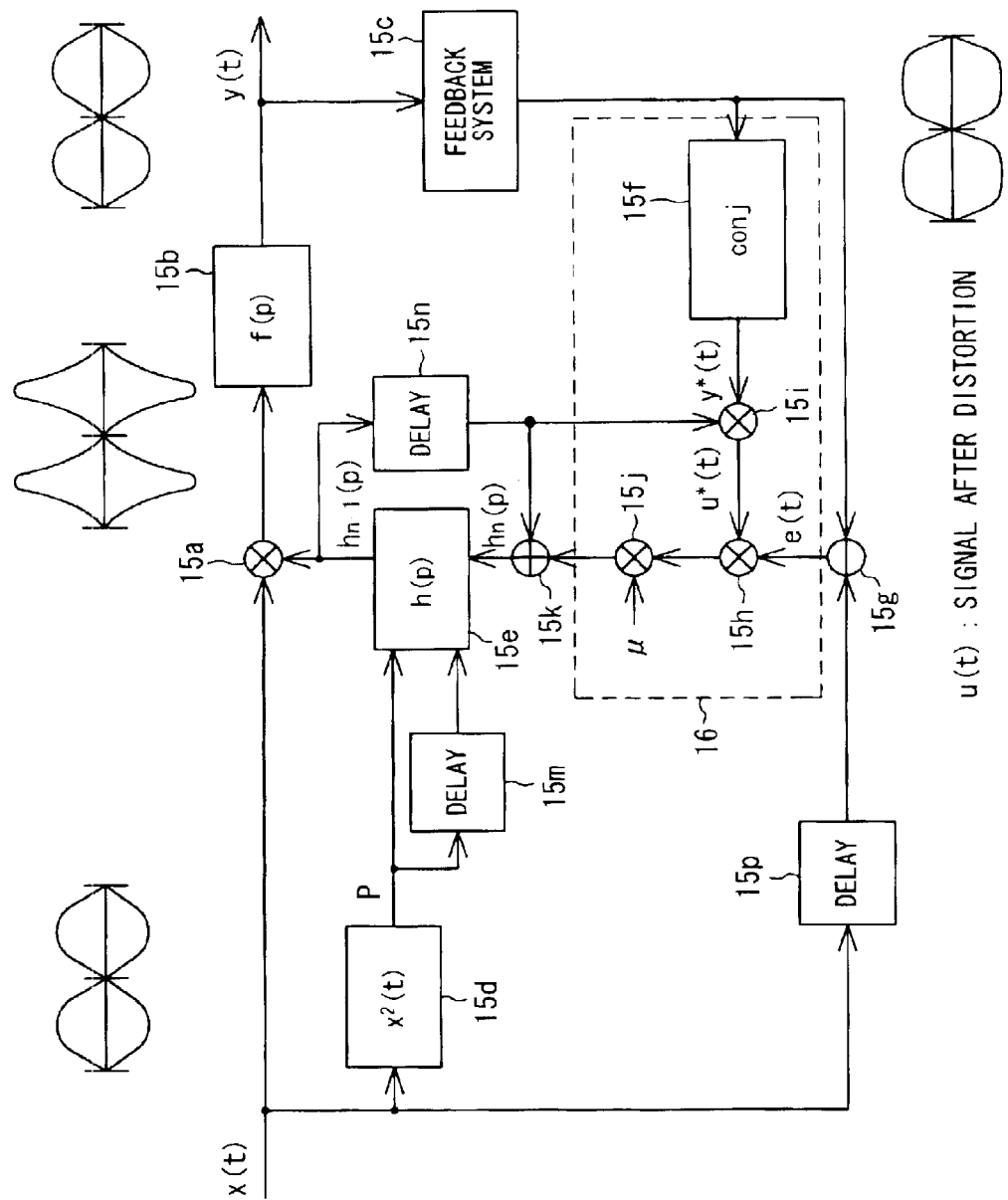
FIG. 31 is a drawing explaining distortion compensation processing using an adaptive LMS algorithm; and, FIG. 32 is a drawing of the overall configuration of a transmission device using a complex representation of the transmission signal x(t).
Figure 32:
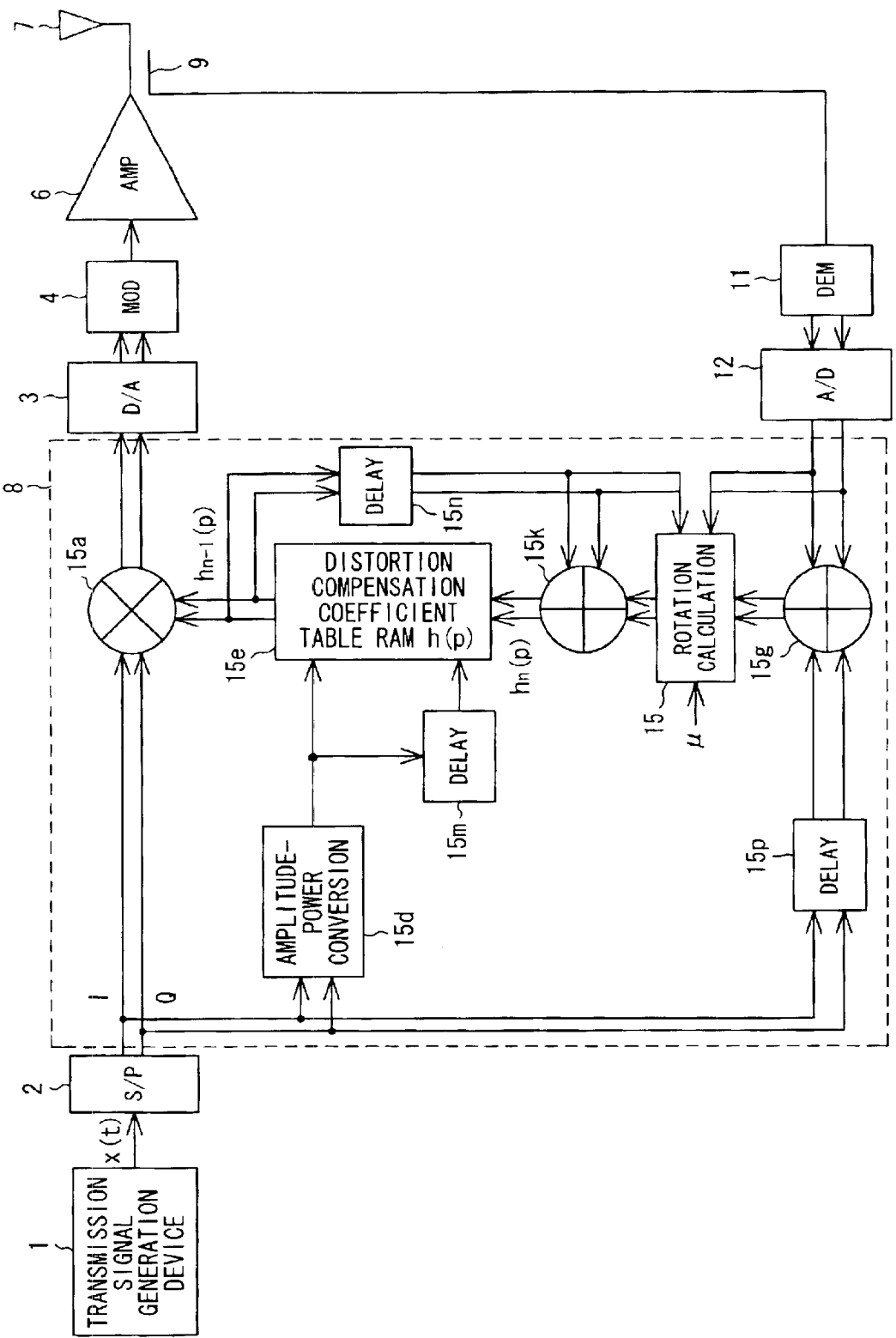

In a distortion compensation device, if the delay times D set in each of the delay circuits 15m, 15n, 15p (see FIG. 31) are not set accurately, the side lobes swell upward as shown by the dashed line in FIG. 1, and power leaking into adjacent channels is increased. Error in the delay times set in each of the delay circuits is correlated with the adjacent channel power ratio (ACLR), the signal-to-noise ratio SNR, the effective number of bits (hereafter "ENOB"), and the out-of-band noise level Pn. The adjacent channel power ratio ACLR is the ratio of the power in the frequency channel of the transmission signal (the signal power) Ps to the power in the adjacent channels P11, P21 and the power in the next-but-one adjacent channels P12, P22; the signal-to-noise ratio SNR is the ratio of the signal power Ps to the noise power (P11, P21, P12, P22, . . . ); the ENOB is a value which is uniquely determined by the SNR; and the noise level Pn is the above-described noise power.

From the above, if one of the above is measured, and the delay time is adjusted such that the value becomes the minimum value or until the value no longer varies, this delay time becomes the accurate total delay time in the transmission power amplifier and feedback loop; by using this delay time, satisfactory distortion compensation can be performed, the power added efficiency of the amplifier can be improved, and power consumption can be reduced. And by improving the power added efficiency, the amount of heat generation can be decreased, heat generation remedies can be curtailed, and the scale of the device can be reduced.

(B) First Embodiment

(a) Overall Configuration

Figure 3:
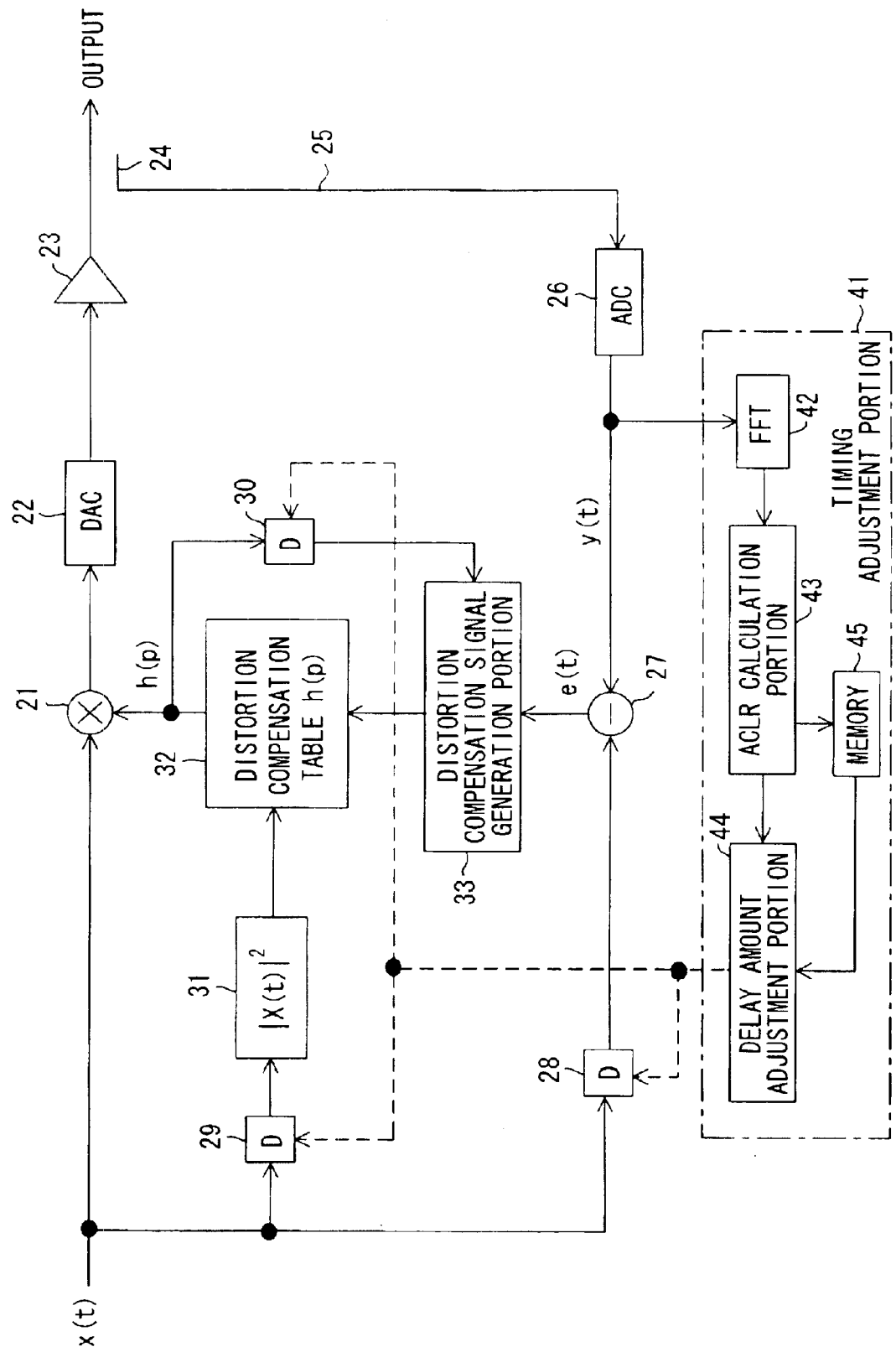
FIG. 3 is a drawing of the configuration of the distortion compensation device of a first embodiment of the invention.

FIG. 3 is a drawing of the configuration of the first embodiment of the invention; 21 is a multiplier which multiplies the digital transmission signal x(t) by the distortion compensation coefficients h(p) to perform predistortion processing, 22 is a DA converter which converts the transmission signal into analog form, 23 is a transmission power amplifier, 24 is a directional coupler which extracts a portion of the transmission signal, 25 is a feedback system which feeds back the output signal from the transmission power amplifier, 26 is an AD converter which converts the analog transmission signal into digital form, 27 is a subtracter which outputs the difference e(t) between the transmission signal x(t) and the feedback signal y(t), 28 to 30 are delay portions which add, to the signal of each portion, the delay time from the time the transmission signal x(t) is input until the feedback signal y(t) is input to the subtracter 26, 31 is a calculation portion (amplitude-power converter) which calculates the power p (=x(t)$^2$) of the transmission signal x(t), 32 is a distortion compensation coefficient storage portion (distortion compensation table) which stores distortion compensation coefficients according to each power level, and outputs the distortion compensation coefficient h(p) according to the power p of the transmission signal x(t) and is updated by the distortion compensation coefficients h(p) determined using an LMS algorithm, 33 is a distortion compensation signal generation portion, which uses adaptive signal processing based on the LMS algorithm to calculate the distortion compensation coefficients h(p) and updates the contents of the distortion compensation table 32 such that the difference between the transmission signal prior to distortion compensation and the feedback signal is zero, and 41 is a timing adjustment portion to adjust the delay times set in the delay portions 28 to 30, which calculates the ACLR using the fast Fourier transform (FFT) and adjusts the delay times.

Figure 2:
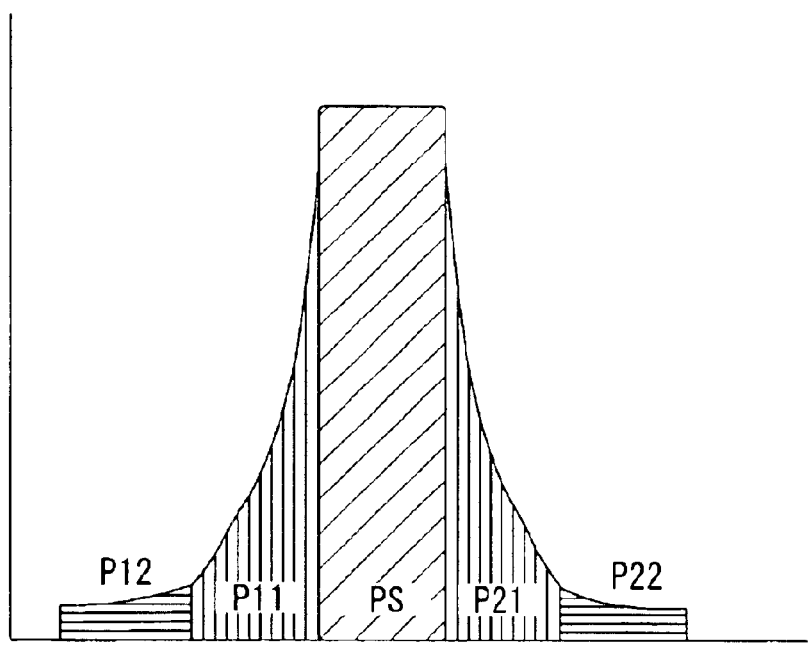
FIG. 2 is a drawing explaining the ACLR.

In the timing adjustment portion 41, the FFT calculation portion 42 accumulates N (=1024) points of AD conversion output data (data at sampling times $t_0$ to $t_{1023}$) output from the AD converter 26, and performs the fast Fourier transform. By means of this FFT calculation, if the sampling period is set to Δt, then a spectrum is obtained at N/2(=512) points with a frequency interval of Δf(=1/Δt·N). The ACLR calculation portion 43 uses the spectrum output from the FFT calculation portion 42 to calculate the ACLR. That is, the spectrum for the band of the frequency channel of the transmission signal is summed to calculate the signal component power Ps (see FIG. 2), and in addition, the spectrum of the frequency bands of adjacent channels and next-but-one adjacent channels are summed to calculate the adjacent channel leakage power P11 and next-but-one adjacent channel leakage power P12. Then, the following equations are used to compute the leakage power ratio (ACLR1 or ACLR2) at time t.

$$ACLR1=P11/P_s \qquad (1)$$

$$ACLR2=P12/P_s \qquad (2)$$

Hereafter these are referred to in general terms as the ACLR. As the ACLR, ACLR1 or ACLR2 can be adopted, and moreover the high-frequency side adjacent channel leakage power P21, P22 can be used to compute the ACLR.

The delay amount adjustment portion 44 compares the current ACLR with the ACLR of the previous cycle stored in memory 45, and based on the comparison results, increases or decreases the delay times, and repeats this delay time adjustment processing to determine the accurate delay time; the delay times are set in the delay portions 28 to 30.

(b) Delay Time Determination Processing

Figure 4:
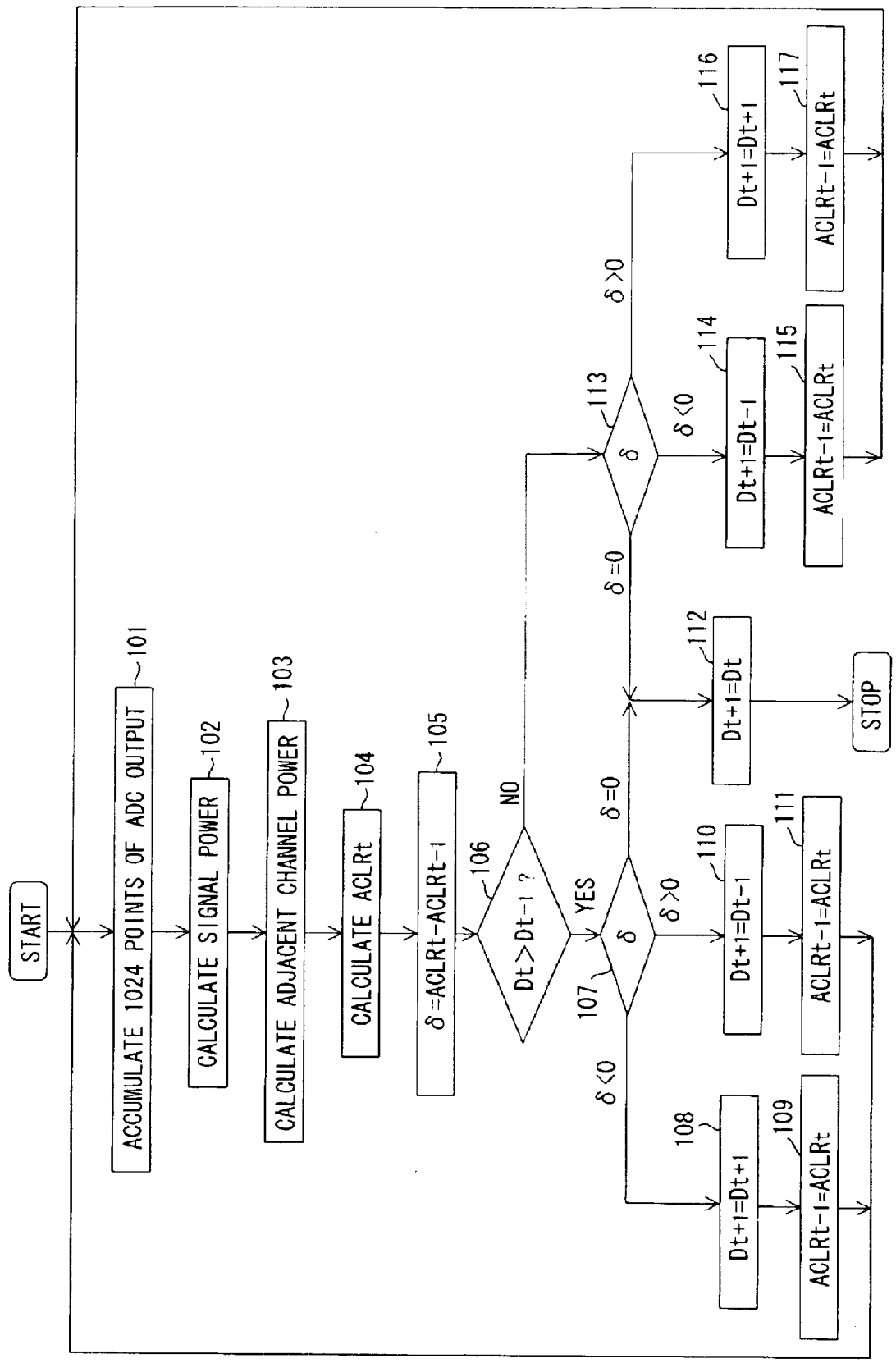
FIG. 4 shows the processing flow to determine the delay time.

FIG. 4 shows the processing flow to determine delay time by the timing adjustment portion 41 of the first embodiment.

The feedback signals for 1024 points output from the AD converter 26 are accumulated (step 101), and a spectrum at prescribed frequency intervals is determined through FFT calculations; using this spectrum, the transmission signal power Ps and adjacent channel power P11 are measured (steps 102 to 103), and from eq. (1) the $ACLR_t$ for this cycle is measured (step 104).

Next, the difference δ between $ACLR_t$ for this cycle and the previous $ACLR_{t-1}$ is calculated (step 105). Here, if the delay amount at time t for this cycle is taken to be $D_t$, and the delay amount at the time t−1 of the previous cycle is $D_{t-1}$, then a check is performed (step 106) to determine whether the relation $$D_t > D_{t-1} \qquad (3)$$

obtains. If the relation obtains, the sign of δ is judged (step 107).

If δ<0, when the delay time is increased ($D_t > D_{t-1}$), the adjacent channel leakage power ACLR decreases and is improved. In this case, the delay amount $D_t$ is increased by 1 and set as $D_{t+1}$ in each of the delay portions 28 to 30 ($D_{t+1}=D_{t+1}$, step 108). Then, taking $ACLR_t$ for this cycle to be $ACLR_{t-1}$ ($ACLR_{t-1}=ACLR_t$, step 109), processing returns to the beginning and the subsequent processing is repeated.

In step 107, if δ>0, when the delay time is increased ($D_t>D_{t-1}$), the adjacent channel leakage power ACLR increases and is worsened. In this case, the delay amount $D_t$ is decreased by 1 and is set in each of the delay portions 28 to 30 as $D_{t+1}$ ($D_{t+1}=D_t-1$, step 110). Then, with $ACLR_t$ for this cycle as $ACLR_{t-1}$ ($ACLR_{t-1}=ACLR_t$, step 111), processing returns to the beginning and the subsequent processing is repeated.

In step 107, if δ=0, the ACLR cannot be further improved, and so the delay time $D_t$ for this cycle is taken to be the delay time $D_{t+1}$ for the next cycle ($D_{t+1}=D_t$, step 112), and delay time adjustment processing ends.

On the other hand, if in step 106 the relation $$D_t>D_{t-1}$$

does not obtain, and $D_t<D_{t-1}$, then the sign of δ is judged (step 113). If the sign is negative, δ<0, when the delay time is decreased ($D_t<D_{t-1}$), the adjacent channel leakage power ACLR decreases and is improved. In this case, the delay amount $D_t$ is deceased by 1 and is set in each of the delay portions 28 to 30 as $D_{t+1}$ ($D_{t+1}=D_t-1$, step 114). Then, taking the $ACLR_t$ of this cycle to be $ACLR_{t-1}$ ($ACLR_{t-1}=ACLR_t$, step 115), processing returns to the beginning and the subsequent processing is repeated.

In step 113, if the sign is positive, δ>0, when the delay time is decreased ($D_t<D_{t-1}$), the adjacent channel leakage power ACLR increases and is worsened. In this case, the delay amount $D_t$ is increased by 1 and set in each of the delay portions 28 to 30 as $D_{t+1}$ ($D_{t+1}=D_t+1$, step 116). Next, taking $ACLR_t$ for this cycle as $ACLR_{t-1}$ ($ACLR_{t-1}=ACLR_t$, step 117), processing returns to the beginning and subsequent processing is repeated.

In step 113, if δ=0, ACLR cannot be further improved, and so the delay time $D_t$ for this cycle is taken to be the delay time $D_{t+1}$ for the next cycle ($D_{t+1}=D_t$, step 112), and delay time adjustment processing ends.

To summarize the above, if $D_t>D_{t-1}$, then the following relations are used:

if $ACLR_t>ACLR_{t-1}$ then $D_{t+1}<D_t$      (4a)

if $ACLR_t=ACLR_{t-1}$ then $D_{t+1}=D_t$      (5a)

if $ACLR_t<ACLR_{t-1}$ then $D_{t+1}>D_t$      (6a)

And if $D_t<D_{t-1}$, the following relations are used:

if $ACLR_t>ACLR_{t-1}$ then $D_{t+1}>D_t$      (4b)

if $ACLR_t=ACLR_{t-1}$ then $D_{t+1}=D_t$      (5b)

if $ACLR_t<ACLR_{t-1}$ then $D_{t+1}<D_t$      (6b)

If this operation is repeated, ultimately the state of eqs. (5a) and (5b) is entered, and the optimum delay amount Dopt for which the ACLR is best can be determined. If this value is set in the delay portions 28 to 30 and distortion compensation processing executed, distortion is decreased, and a spectrum like that shown by the dashed line in (b) of FIG. 27 can be obtained. By this means the power added efficiency of the amplifier can be improved, and low power consumption is possible. Also, by improving the power added efficiency, the amount of heat generation can be reduced, and heat generation remedies can be curtailed, as a result of which the device scale can be reduced.

As an initial value, the delay amount may be set to 0, or may be set to a fixed value. There are two actual types of ACLR1, on the high-frequency side (ACLR1+) and on the low-frequency side (ACLR1−); similarly, there are two types of ACLR2, ACLR2+ and ACLR2−. The average value of ACLR1+ and ACLR1− may be adopted as the value of ACLR. Or, weighting of ACLR1 and ACLR2 may be performed to calculate ACLR.

When in the above-described delay control a modulation wave is used as the transmission signal x(t), delay time determination control is performed based on the adjacent channel leakage power ratio ACLR as described above, and when a continuous wave CW is used as the transmission signal x(t), control is performed using SNR or ENOB. The procedure is described below.

Figure 5:
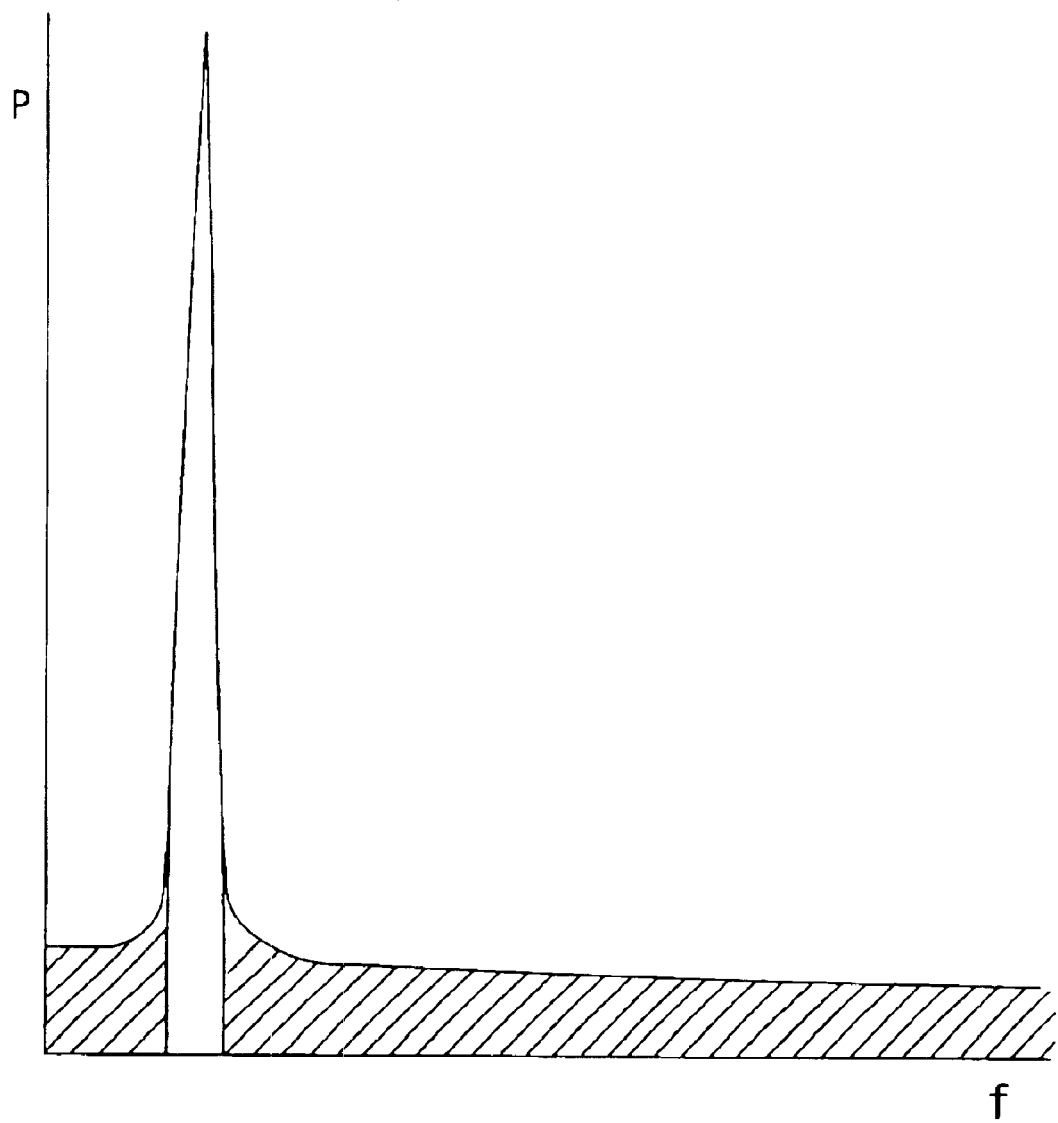
FIG. 5 is a drawing explaining the SNR.

First, from the spectrum of the FFT result, the signal power Ps (the area enclosed by the solid line in FIG. 5) and the noise power Pn (the shaded area in FIG. 5) are calculated, and the SNR is computed from the equation $$SNR=P_s/P_n \qquad (7)$$

Subsequently, in the flow of FIG. 4, the SNR is used in place of the ACLR to similarly determine the delay time. When the ENOB is to be used, the equation $$ENOB=(SNR-1.76)/6.02 \text{ (dB)} \qquad (8)$$

is employed to calculate the ENOB, and in the flow of FIG. 4 the ENOB is used in place of the ACLR to similarly determine the delay time. When performing control using the noise level, the modulation wave may be used as the transmission signal, or the continuous wave CW may be used.

(c) MODIFICATION EXAMPLES

First Modification Example

Figure 6:
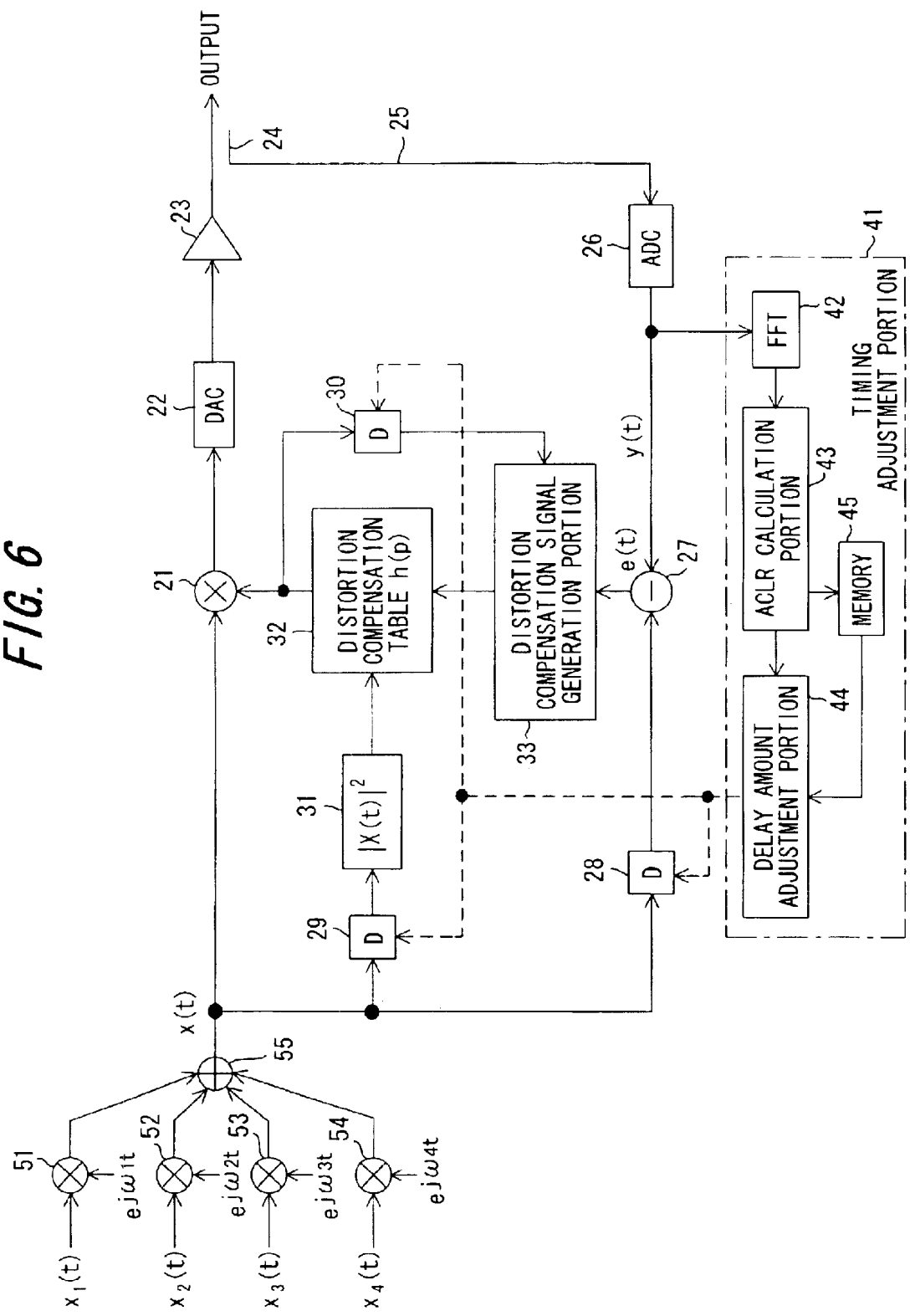
FIG. 6 is a first modification example of the first embodiment.

The first embodiment describes application to a single carrier transmission device, but application to a multicarrier transmission device is also possible. FIG. 6 shows the configuration when using a multicarrier signal to transmit a plurality of transmission signals, and shows an example in which four frequencies are multiplexed for transmission. Each of the digital transmission signals $x_1(t)$ to $x_4(t)$ is multiplied by $\exp(j\omega_1 t)$ to $\exp(j\omega_4 t)$ ($\omega n=2\pi t$) by the frequency shifting portions 51 to 54 and is frequency-shifted to $f_1$ to $f_4$, and these are then frequency-multiplexed by the synthesizer 55. This digital frequency-multiplexed signal corresponds to the single carrier transmission signal, and subsequently distortion compensation processing similar to the case of a single carrier is performed.

Second Modification Example

In the first embodiment, delay time determination processing was ended when the ACLR or SNR for the previous cycle and for the current cycle coincided; but a configuration is possible in which the delay time determination processing is ended when a value is equal to or less than a prescribed threshold.

Figure 7:
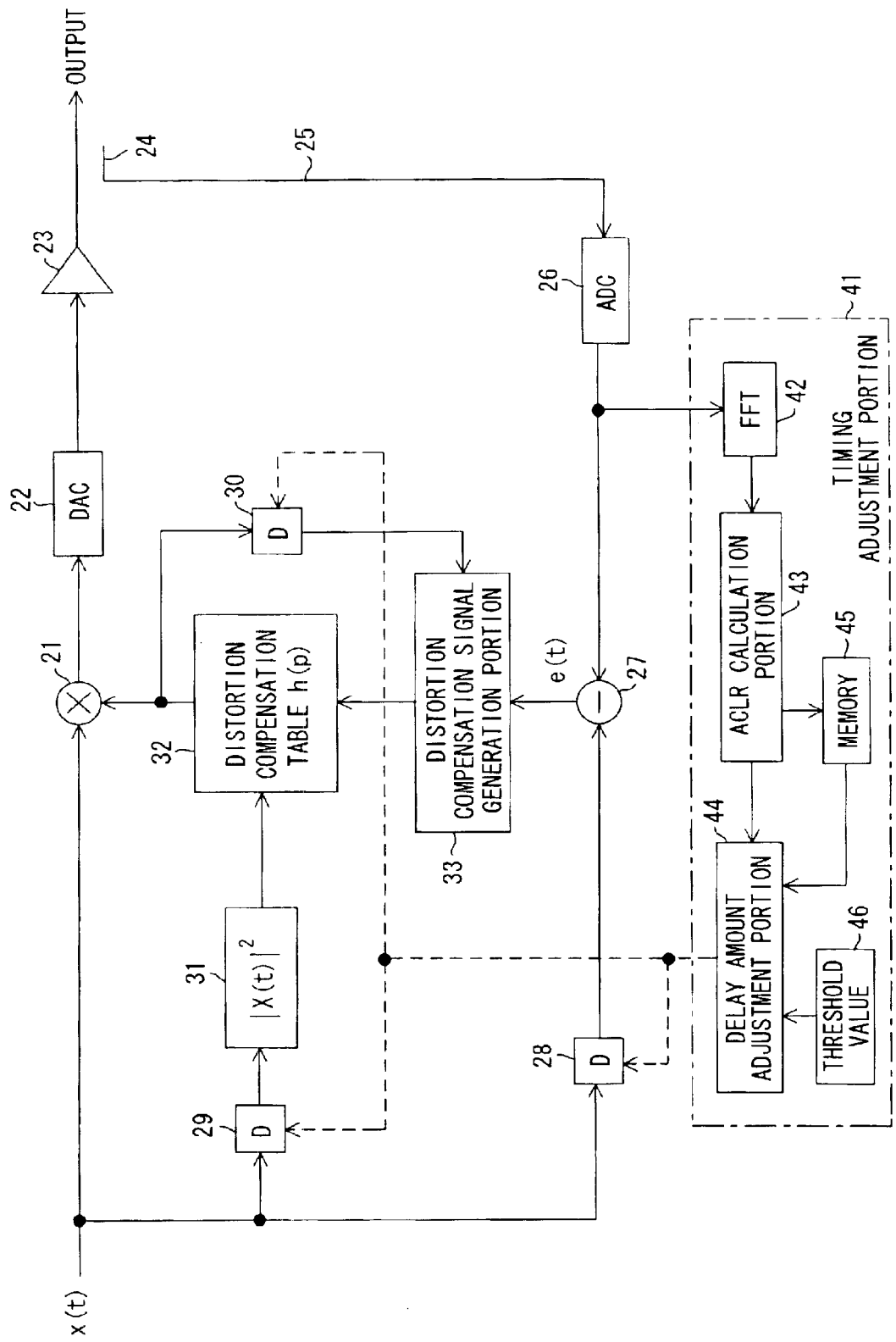
FIG. 7 is a second modification example of the first embodiment.
Figure 8:
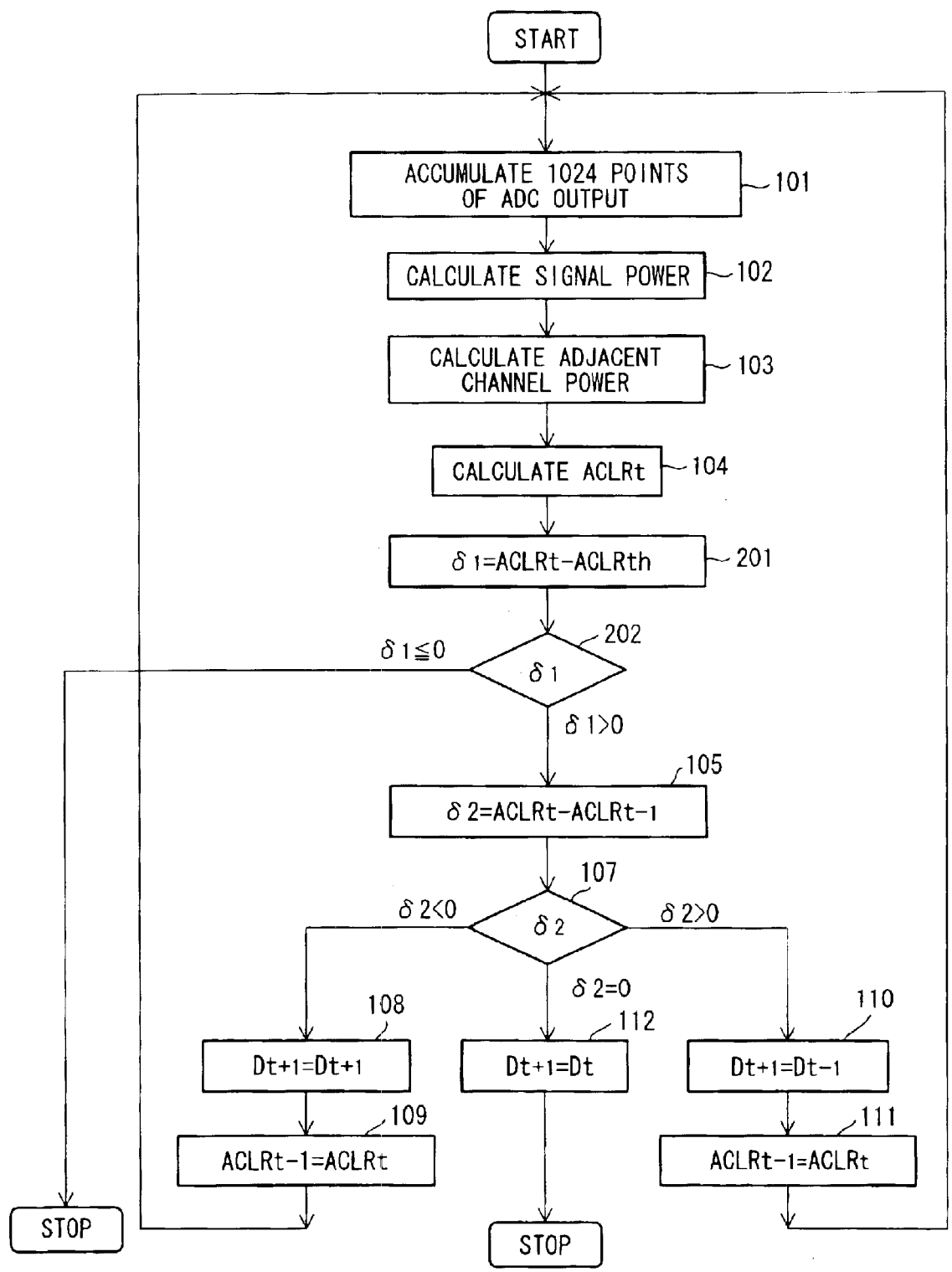
FIG. 8 shows the processing flow to determine the delay time in the second modification example.

FIG. 7 shows the configuration of this second modification example; FIG. 8 shows the processing flow for delay time determination. The processing flow is for the case in which the delay time is $D_t>D_{t+1}$, and processing for the case $D_t<D_{t+1}$ is omitted. In FIG. 7, a difference with the first embodiment of FIG. 3 is the provision of a threshold setting portion 46; in the processing flow of FIG. 8, a difference with the processing flow of FIG. 4 is the fact that delay time determination processing ends when the $ACLR_t$ for the current cycle is equal to or less than a threshold ACLRth. That is, in step 202 the difference $δ_1$ between the current ACLRt and the threshold ACLRth (=ACLRt−ACLRth) is computed, and in step 201 a check is performed to determine whether the difference $\delta_1$ is equal to or less than 0; if $\delta_1 \leq 0$, delay time determination processing ends, and if $\delta_1 > 0$, the difference $\delta_2$ between the current and the next ACLR is computed (step 105), and thereafter processing similar to that of FIG. 4 is performed according to whether $\delta_2$ is positive, negative, or zero. However, in the processing flow it is assumed that the previous and current delay times are such that $D_t > D_{t+1}$.

However, after accumulation of N=1024 points, FFT calculations can be performed for each data sample; but because high-speed processing is necessary, intermittent processing of the N=1024 points can reduce power consumption.

By means of the second modification example, when the current ACLR is equal to or less than a threshold value, it is judged that convergence has occurred, and the delay time $D_t$ at this time is taken to be the optimum value and is set in each of the delay portions 28 to 30 to perform distortion compensation. By this means, convergence is achieved more rapidly than in the first embodiment. Also, by performing FFT calculations intermittently for the N=1024 points, power consumption can be reduced.

Third Modification Example

In the second modification example, the FFT calculation portion 42 performs FFT calculations intermittently using a constant number (N=1024) of AD converted outputs; however, initially a small number of AD converted output data items can be used to perform FFT calculations, and as the difference between the delay time and the threshold value decreases, the number of points can be increased.

Figure 9:
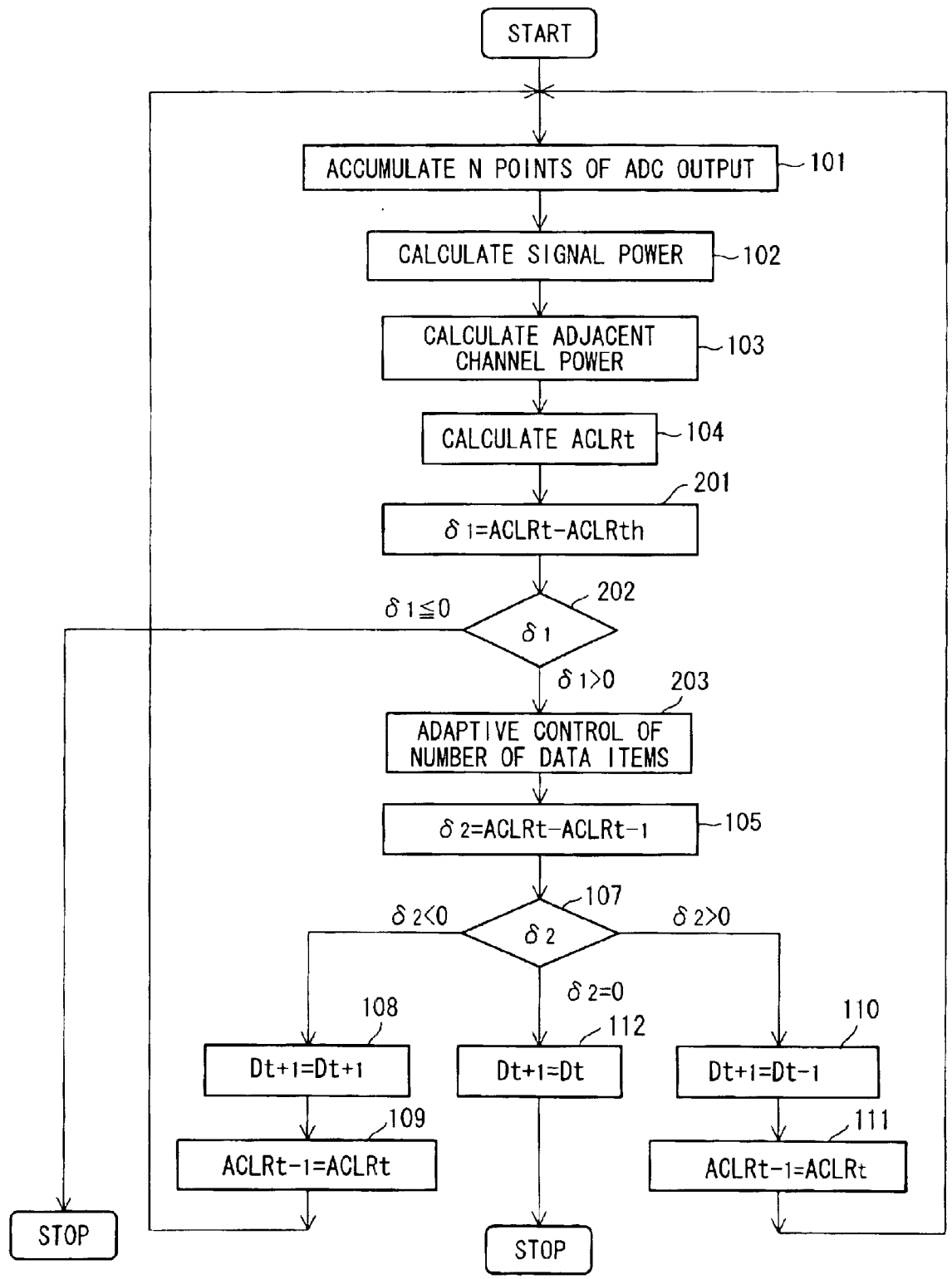
FIG. 9 shows the processing flow to determine the delay time in a third modification example.

FIG. 9 shows the flow of delay time determination processing of the third modification example, in which the number of AD converted data items is variable; portions which are the same as in the processing flow of FIG. 8 are assigned the same symbols. A difference is the inclusion of a step 203 in which, if after step 202 the current ACLRt is not equal to or less than the threshold ACLRth, the number of AD converted data items N used in FFT calculations is adaptively controlled according to the difference $\delta_1$ (=ACLRt−ACLRth).

For example, the number of points for which FFT calculations are performed is decreased to 256 points, and as distortion compensation proceeds, the number is increased to 512 points and FFT calculations are performed, until when the ACLR is further improved the number is increased to 1024 points, successively reducing the frequency intervals over which the spectrum is obtained. By this means, not only can the delay adjustment control be made to converge more rapidly, but the convergence stability is increased, and high-precision delay adjustment can be performed.

Fourth Modification Example

The overall delay time of the transmission power amplifier 22 and feedback system 25 changes with aging. Hence it is necessary to periodically perform delay time determination processing, and to always set accurate delay times in the delay portions 28 to 30.

Figure 10:
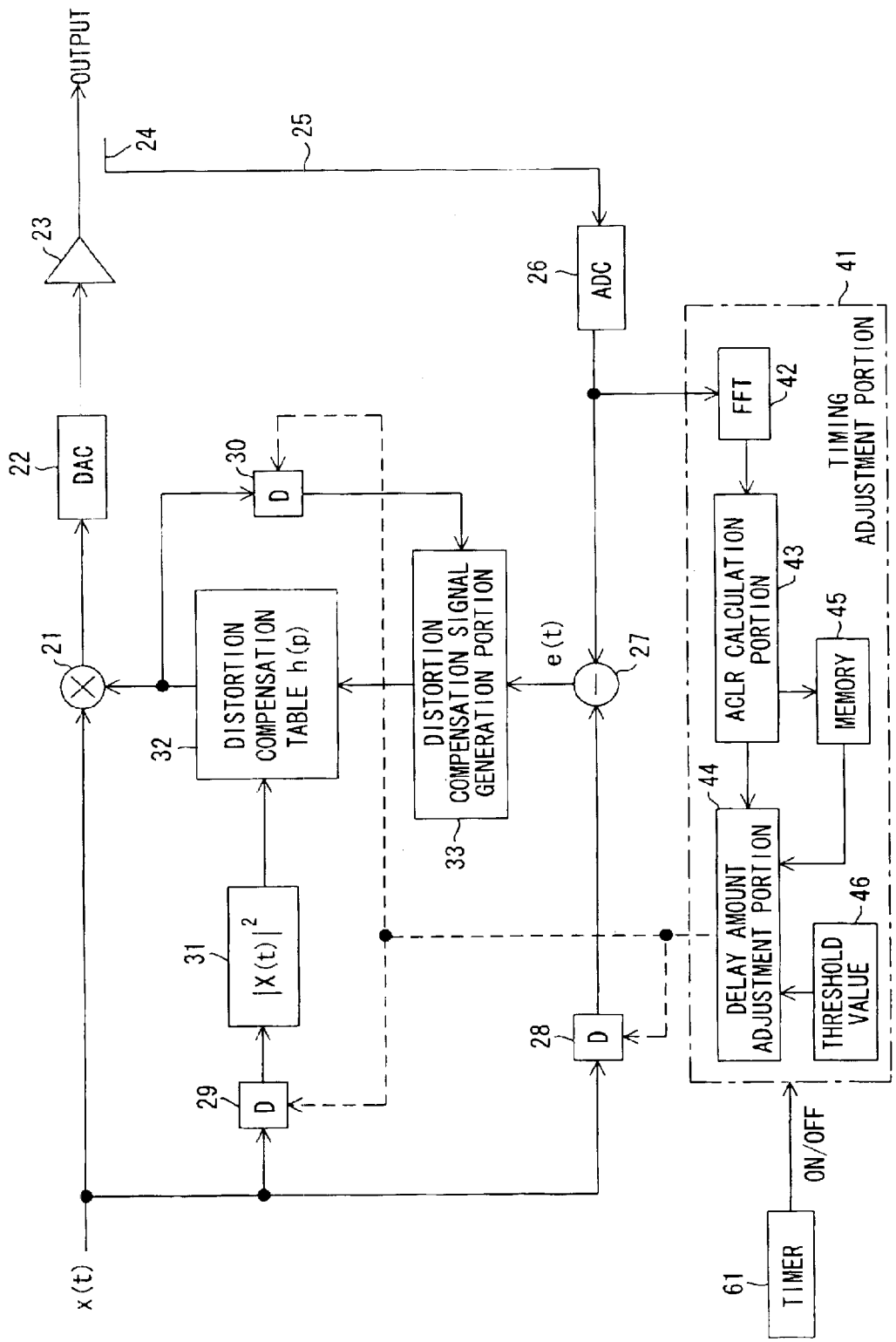
FIG. 10 is a fourth modification example of the first embodiment.
Figure 11:
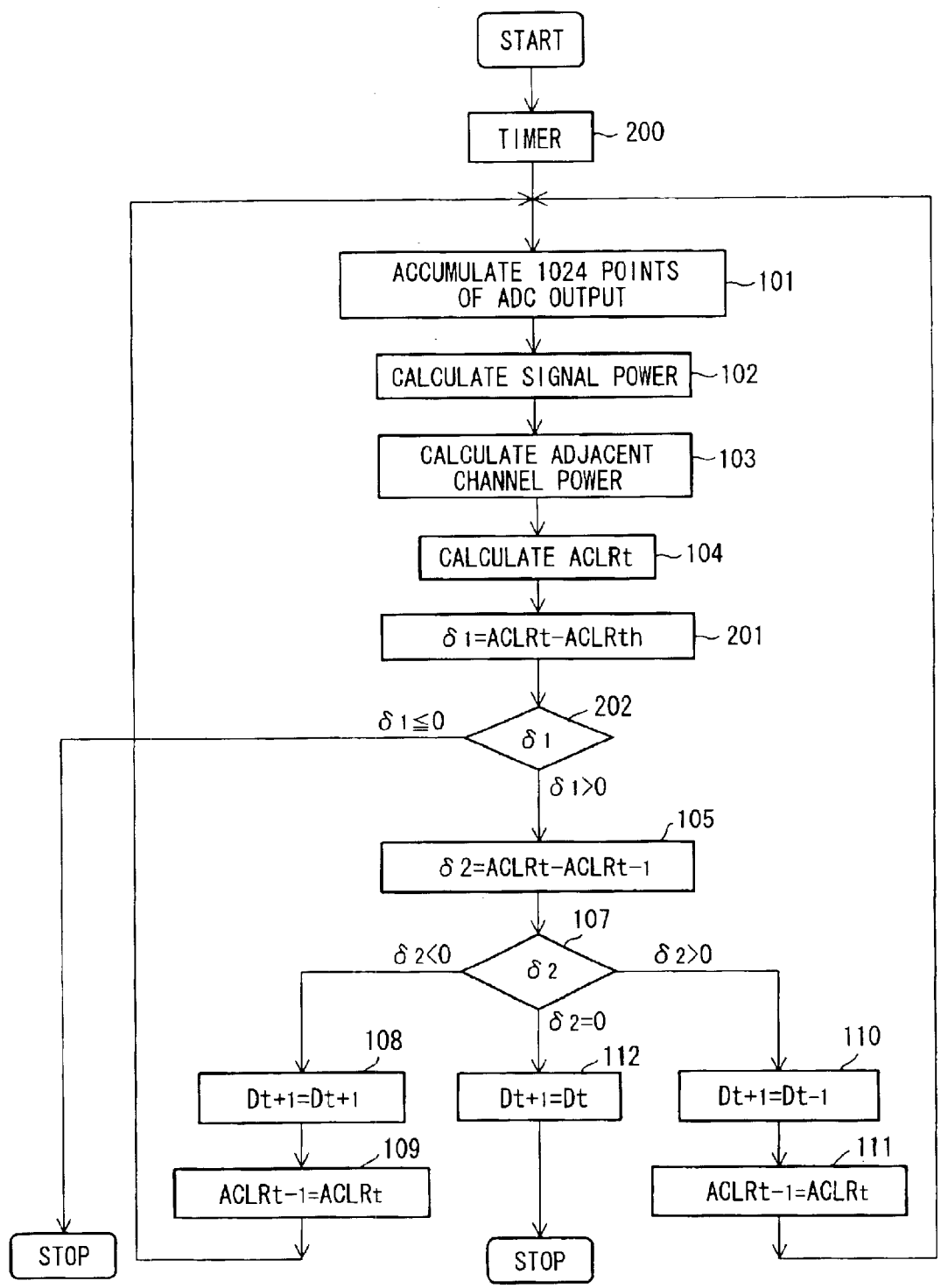
FIG. 11 shows the processing flow to determine the delay time in the fourth modification example.
Figure 12:
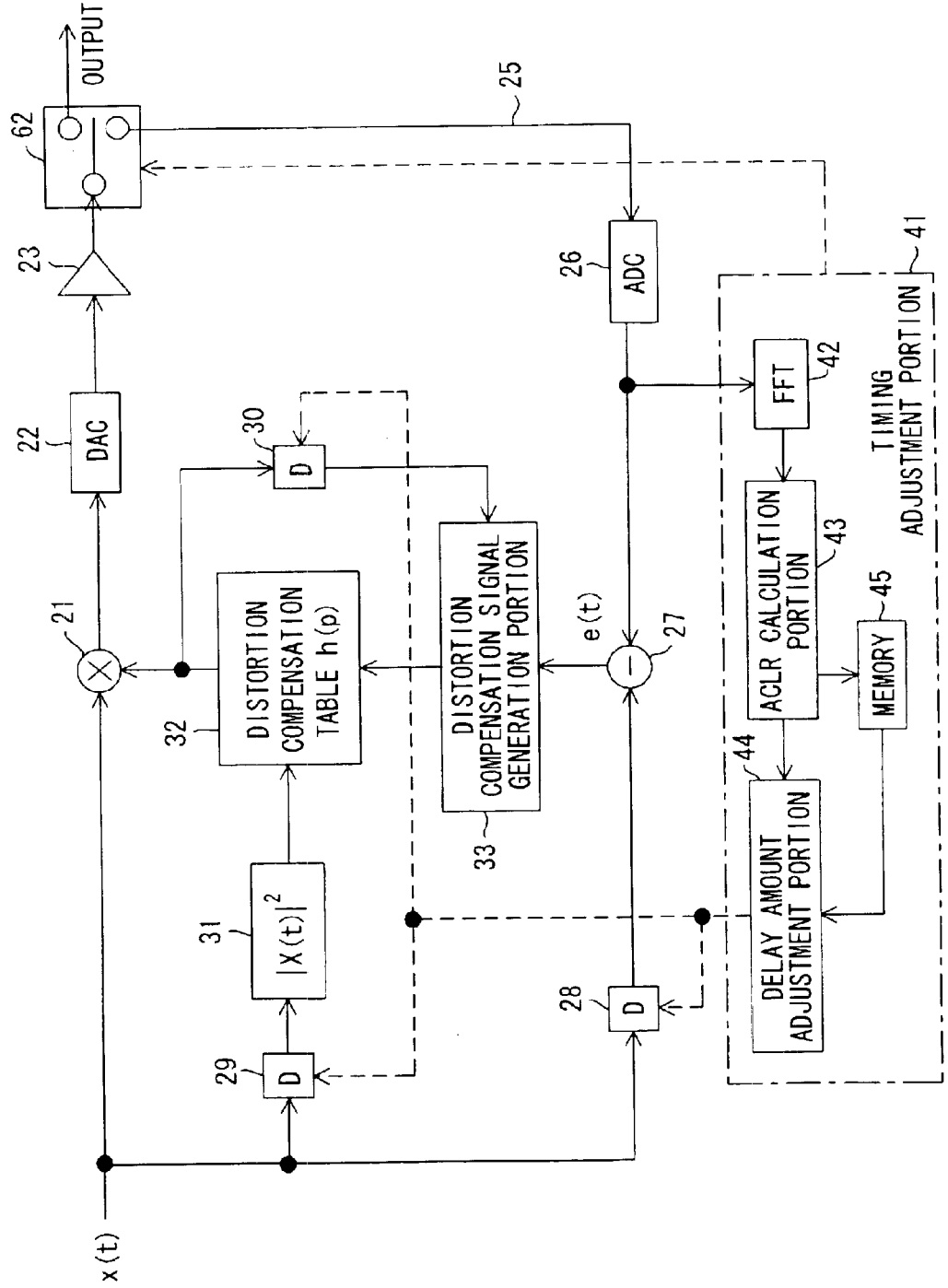
FIG. 12 is a fifth modification example of the first embodiment.

FIG. 10 shows the configuration of the fourth modification example in which delay times are determined intermittently; FIG. 11 shows the flow of delay time determination processing of the fourth modification example. Portions which are the same as in the second-modification example of FIG. 7 and FIG. 8 are assigned the same symbols. In FIG. 10, a difference with the second modification example of FIG. 7 is the provision of a timer 61; in the processing flow of FIG. 11, a difference with the processing flow of FIG. 8 is the fact that, when in the initial step 200 the timer 61 specifies the initiation of delay time determination processing, the delay time determination processing of step 101 and below is performed. By means of this intermittent operation, there is no need to constantly perform delay time determination processing, and so power consumption can be reduced.

Fifth Modification Example

The total delay time of the transmission power amplifier 22 and feedback system 25 changes depending on individual differences among devices. Hence the delay time is adjusted at the time of manufacture at the plant to determine the optimum delay time Dopt, which is stored in memory, and during actual use this value is employed to perform distortion compensation control. By this means, there is no need to perform delay time decision adjustment during operation, the timing adjustment portion 41 can be omitted, and there are advantages related to device scale also.

In light of the above, in the fifth modification example a switch 62 is used in place of a directional coupler. The switch 62 inputs the output signal of the transmission power amplifier 22 to the AD converter 26 during delay time determination control, and during operation inputs the output-signal of the transmission power amplifier 22 to an antenna, not shown. As a result, unnecessary waves are not emitted even if delay time determination control is performed at the time of manufacturing. And, because there is no loss in feedback, in contrast with a directional coupler, the optimum delay time Dopt can be determined with high precision and stored in memory, and during actual use this value can be used to perform appropriate distortion compensation control. Also, by providing a timing adjustment portion 41, the optimum value of the delay time at the time of manufacturing can be used as the initial value, and in actual use the delay time can be updated. Consequently, changes with aging can be accommodated.

Although not shown in the drawings, the first through fifth modification examples can be combined appropriately to configure a distortion compensation device.

(C) Second Embodiment

The first embodiment was an example of application to a distortion compensation device which multiplies the transmission signal by distortion compensation coefficients to generate the distortion compensation signal for input to the transmission power amplifier; however, application is also possible to a distortion compensation device which, after independently DA converting the main signal (transmission signal) and the distortion components (error signal) added to the transmission signal, synthesizes the signals and inputs the result to the transmission power amplifier. By means of the latter distortion compensation device, because the amplitude of the error signal is small, the bit precision of the DA converter which outputs the error signal alone can be made small, and there is also no need for a large dynamic range in the DA converter which outputs the transmission signal alone, so that there is the further advantage that the bit precision of this DA converter can be made small.

(a) Configuration

Figure 13:
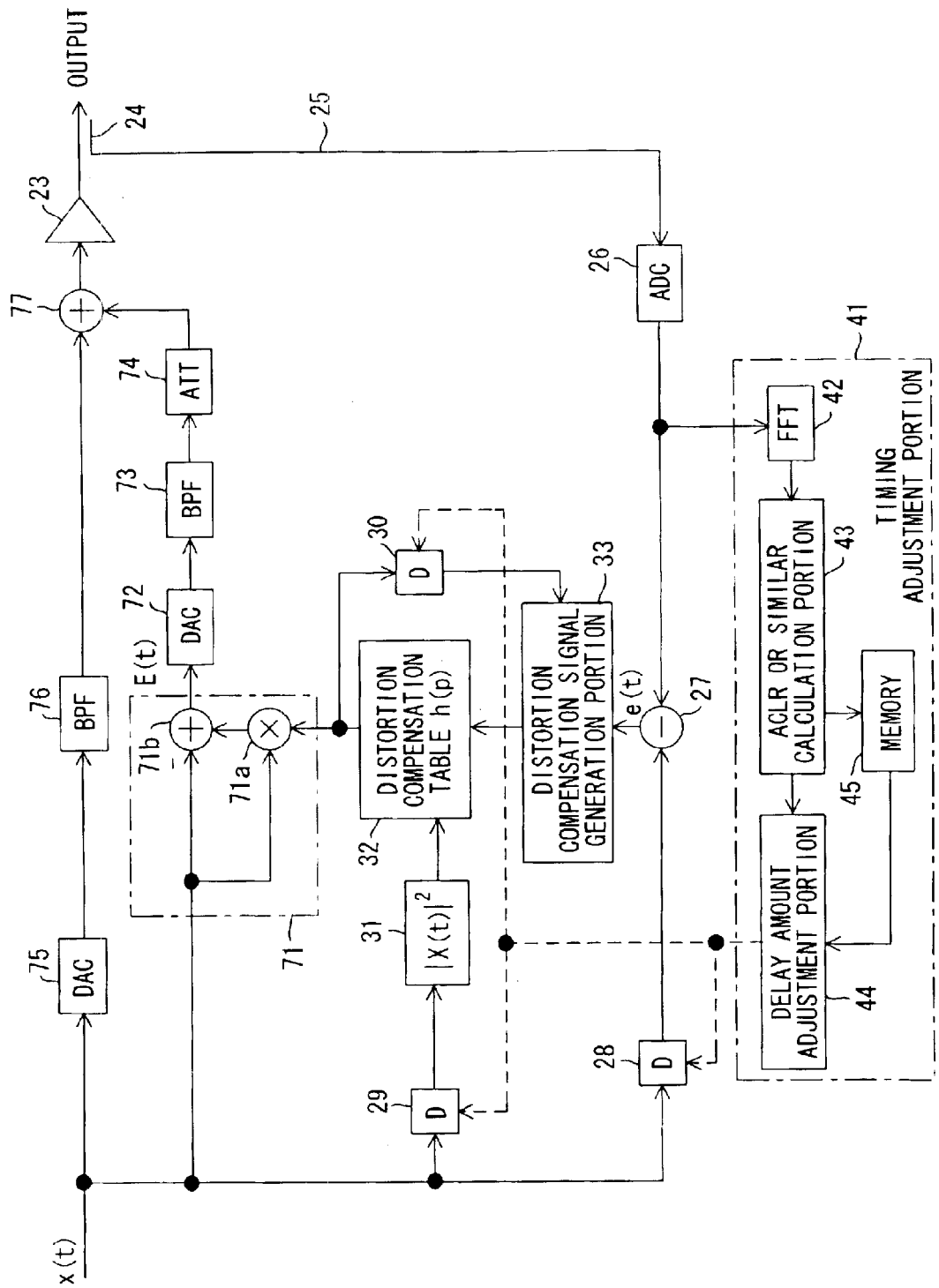
FIG. 13 is a drawing of the configuration of the distortion compensation device of a second embodiment.

FIG. 13 shows the configuration of the distortion compensation device of the second embodiment; portions which are the same as in the first embodiment are assigned the same symbols.

71 is an error signal generation portion, which has a multiplier 71a which reads the distortion compensation coefficient $h_n(p)$ corresponding to the power $|x(t)|^2$ of the transmission signal $x(t)$ from the distortion compensation table 32 and multiplies this distortion compensation coefficient $h_n(p)$ by the transmission signal $x(t)$, and a subtracter 71b which outputs the error signal $E(t)$ which is the difference between the output signal $x(t) \cdot h_n(p)$ of the multiplier and the transmission signal $x(t)$. 72 is a DA converter which converts digital error signals $E(t)$ into analog form, 73 is a band-pass filter which passes only the error signal component in the necessary band and shapes the waveform, 74 is an attenuator which adjusts the output, 75 is a DA converter which converts the transmission signal (main signal) $x(t)$ into analog form, 76 is a band-pass filter which excludes unnecessary channel signal components from the transmission signal, and 77 is a signal synthesis portion which synthesizes and inputs to the transmission power amplifier 23 the analog transmission signal $x(t)$ and analog error signal $E(t)$. Otherwise the configuration and delay time adjustment control are the same as in the first embodiment (FIG. 3, FIG. 4).

(b) MODIFICATION EXAMPLES

First Modification Example

Figure 14:
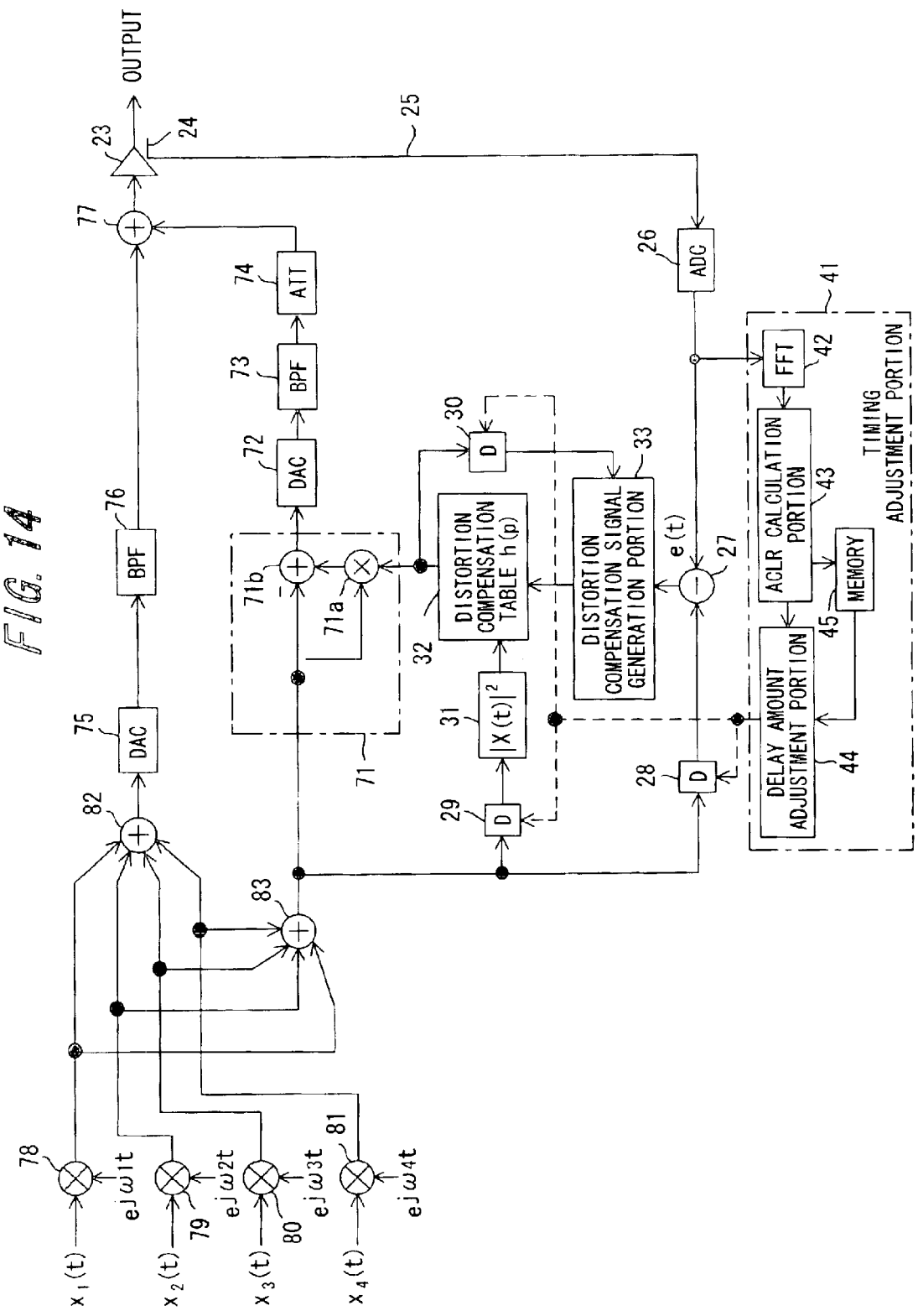
FIG. 14 is a first modification example of the second embodiment.

The second embodiment can be applied to a single carrier transmission device, but application to a multicarrier transmission device is also possible. FIG. 14 shows the configuration for the case of transmission of a plurality of transmission signals using a multicarrier signal, and is an example in which four frequencies are multiplexed and transmitted. Each of the digital transmission signals $x_1(t)$ to $x_4(t)$ is multiplied by $\exp(j\omega_1 t)$ to $\exp(j\omega_4 t)$ ($\omega n=2\pi t$) by the frequency shifting portions 78 to 81 and is frequency-shifted to $f_1$ to $f_4$, and these are then frequency-multiplexed by the synthesizer portions 82, 83. This digital frequency-multiplexed signal corresponds to the single carrier transmission signal, and subsequently distortion compensation processing similar to the case of a single carrier is performed.

Figure 15:
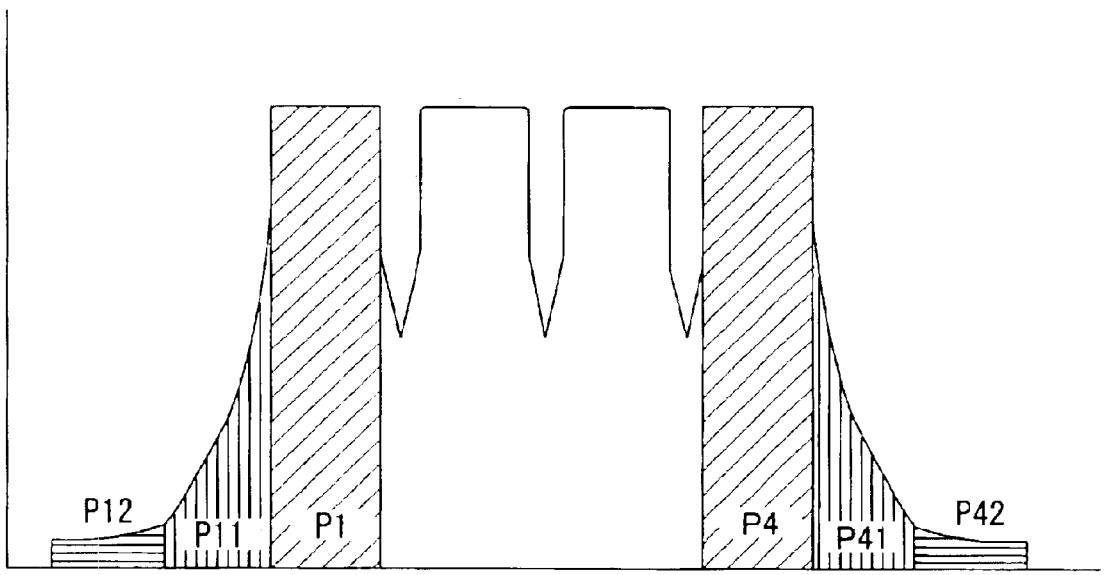
FIG. 15 is a diagram of the spectrum for four waves.

In the case of four-waves, the spectrum is as shown in FIG. 15, so that the power P1 of the signal component and the adjacent channel leakage power P11 are computed, and the adjacent channel leakage power ratio ACLR is then computed using the equation $$ACLR = P11/P1 \text{ adjacent channel leakage power ratio} \quad (9)$$

This adjacent channel leakage power ratio ACLR is then used to determine the delay time according to the flow of FIG. 4. By setting the delay time thus determined in the delay portions 28 to 30 and performing distortion compensation, the spreading of the spectrum in FIG. 15 is alleviated, and the spectrum approaches that of four rectangles, and distortion is compensated. By this means the power added efficiency of the amplifier can be improved, and low power consumption becomes possible. And as a result of the improvement in power added efficiency, heat generation can be decreased, and heat generation remedies can be curtailed, as a result of which the device scale can be reduced.

As the initial value, the delay amount may be set to 0, or may be set to a constant value. Also, in actuality there are two types of adjacent channels, on the upper and lower frequency sides. Hence either one of these, or the average, or the sum of the two can be used.

Second Modification Example

Figure 16:
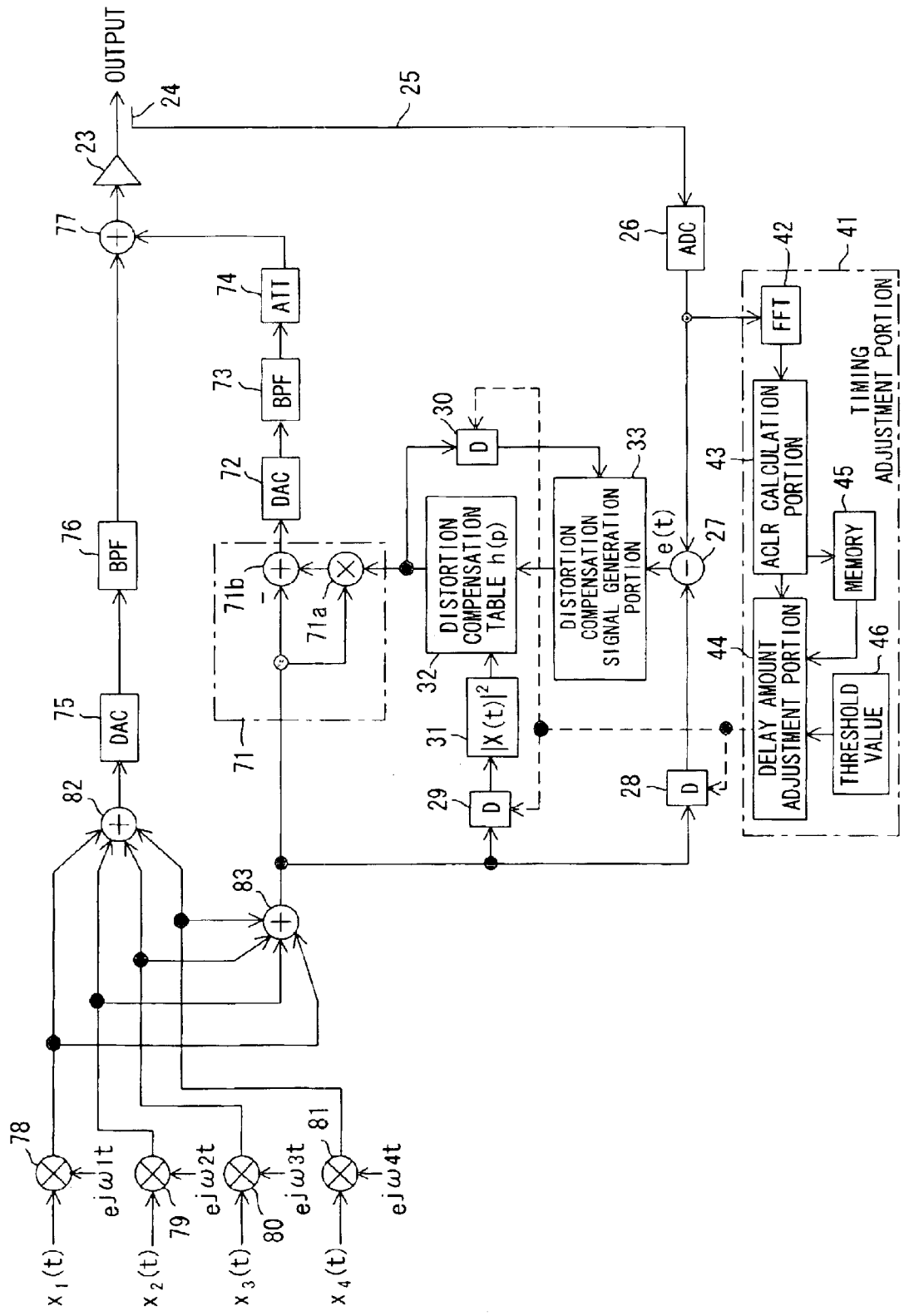
FIG. 16 is a second modification example of the second embodiment.

In the first modification example, delay time determination processing was ended when the ACLR for the previous cycle and for the current cycle coincided; but a configuration is possible in which the delay time determination processing is ended when a value is equal to or less than a prescribed threshold. FIG. 16 shows the configuration of this second modification example; portions which are the same as in the first modification example of FIG. 14 are assigned the same symbols. A difference with the first modification example of FIG. 14 is the provision of a threshold setting portion 46; determination of the delay time is performed according to the processing flow of FIG. 8. That is, delay time determination processing ends when the current ACLRt is equal to or less than a threshold ACLRth.

Third Modification Example

Figure 17:
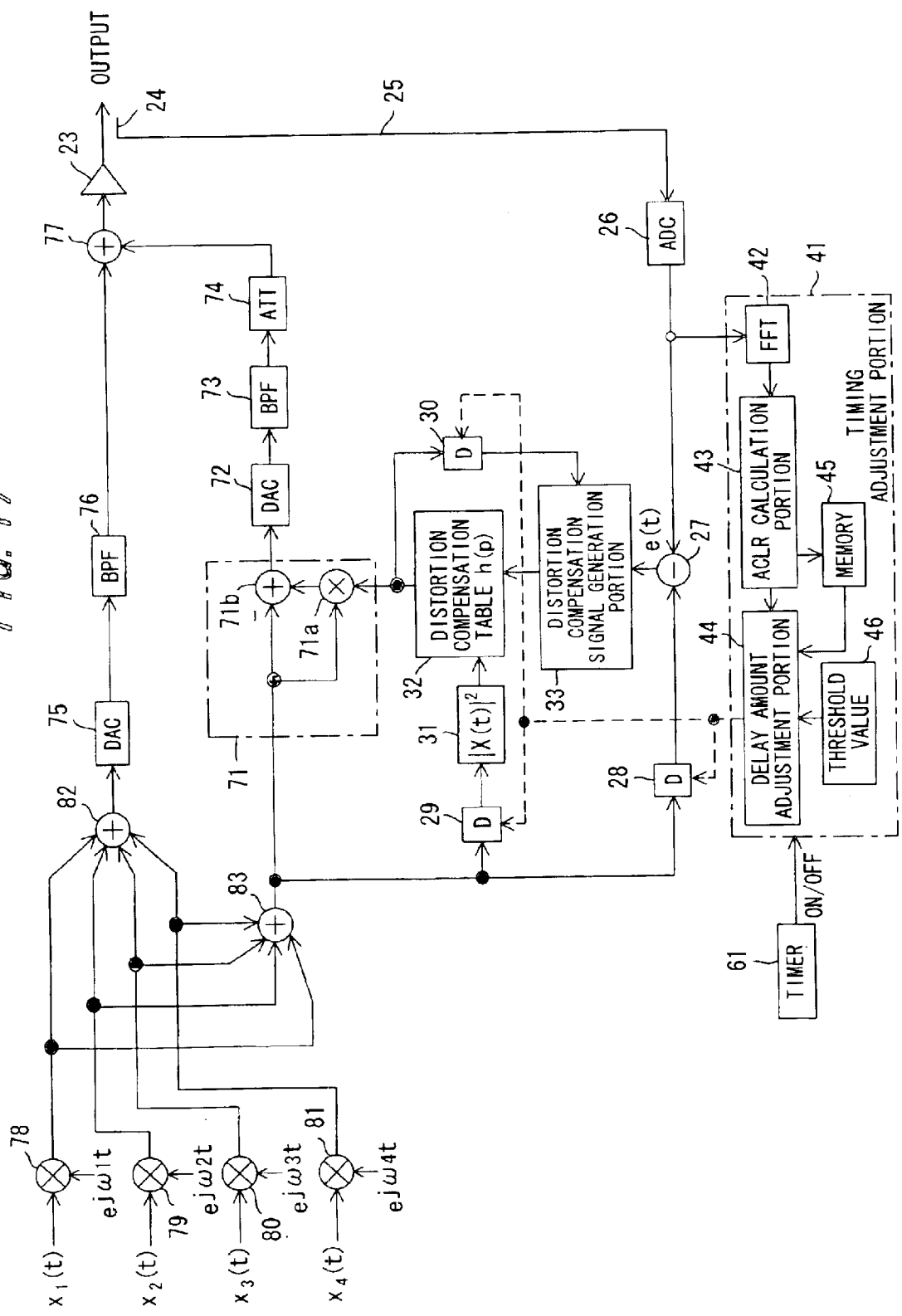
FIG. 17 is a third modification example of the second embodiment.

The total delay time of the transmission power amplifier 22 and feedback system 25 undergoes changes with aging. Hence it is necessary to periodically perform delay time determination processing, and to always set accurate delay times in the delay portions 28 to 30. FIG. 17 shows the configuration of a third modification example in which the delay time is determined intermittently; portions which are the same as in the first modification example of FIG. 14 are assigned the same symbols. A difference with the first modification example is the provision of a timer 61; when the initiation of delay time determination processing is specified periodically by the timer 61, delay time determination processing is performed. By means of this intermittent operation, there is no need to constantly perform delay time determination processing, and so power consumption can be reduced.

(D) Third Embodiment

(a) Summary of the Third Embodiment

In the first and second embodiments, the result for the ACLR or similar determined by FFT calculations was employed to set the total delay time for the transmission power amplifier 22 and feedback system 25 in the delay portions 28 to 30. The third embodiment differs from the first and second embodiments in that the result for the ACLR or similar determined by FFT calculations is used to control the phase lead or lag of the clock CLK (also called an encoding signal) of the AD converter 26.

Specifically, the characteristic of the adjacent channel leakage power ACLR, signal-to-noise power ratio SNR, ENOB or similar varies depending on the timing of the clock CLK input to the AD converter 26. Below is an explanation for the case of the SNR. The SNR varies depending on the extent of the lag in the timing of the rising edge of the clock CLK relative to the conversion point of the input signal to the AD converter 26. In other words, when the eye pattern is considered, the eye opening is greatest between the signal transition point and conversion point, so that it is best that the clock rises and sampling is performed in this interval, and the best value for the SNR is then obtained. On the other hand, if the timing of the input signal transition point and the clock CLK coincide, in the worst case data becomes indeterminate and the SNR is degraded. Hence by controlling the clock phase to prevent this and improve the SNR, the overall characteristics of the distortion compensation device are improved, and consequently the efficiency of the transmission power amplifier is improved.

(b) Overall Configuration

Figure 18:
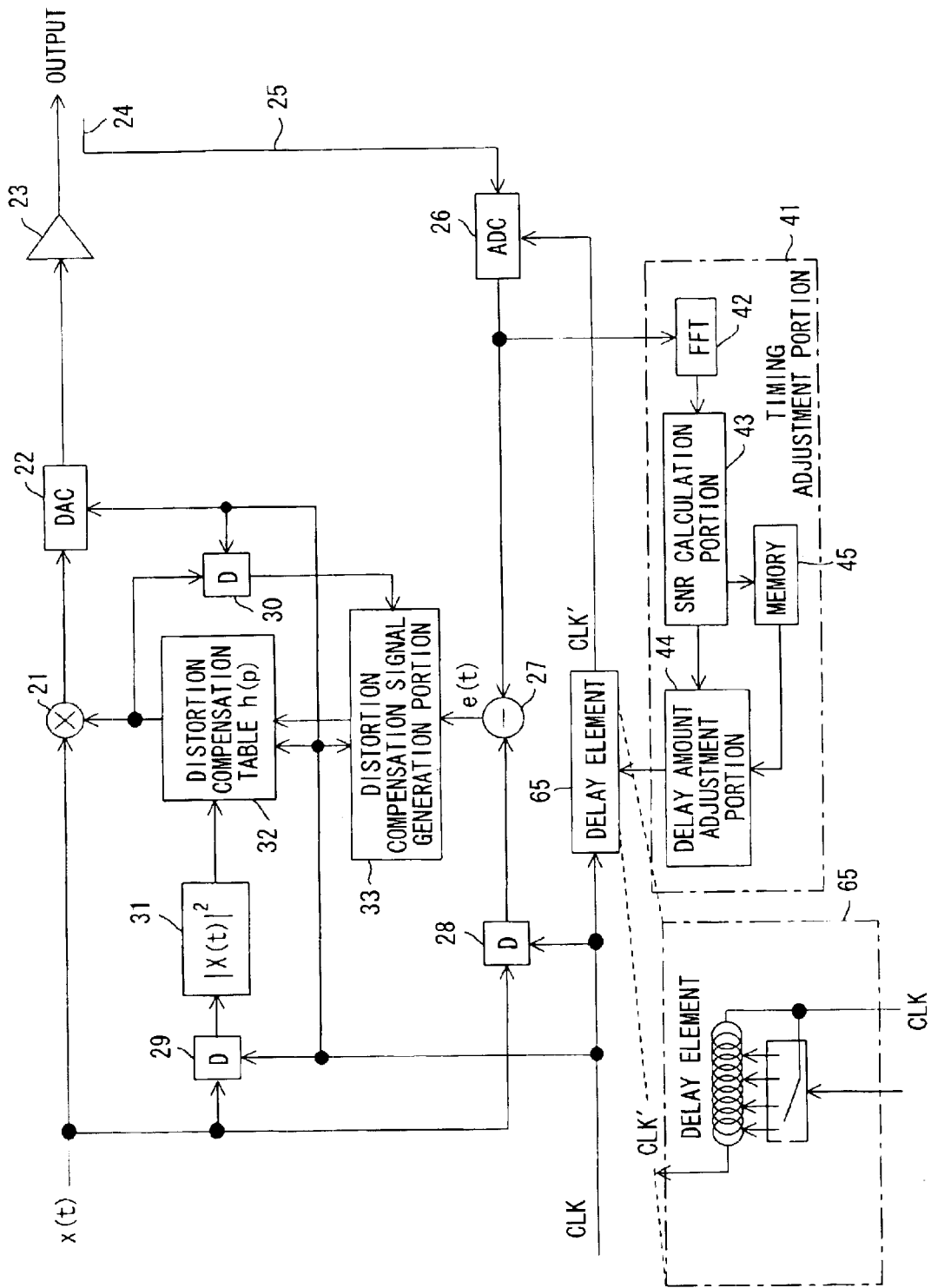
FIG. 18 is a drawing of the configuration of the distortion compensation device of a third embodiment.

FIG. 18 shows the configuration of the third embodiment of the invention; 21 through 33 and 41 through 44 indicate the same portions as in the first embodiment, and have the same functions. The delay element 65 is a clock phase delay element which varies the phase of the clock CLK' of the AD converter 26 in increments of ΔD, and causes the phase of the clock CLK' to lead or lag in increments of ΔD according to an instruction from the delay amount adjustment portion 44. In the timing adjustment portion 41, the FFT calculation portion 42 accumulates AD conversion output data for N (=1024) points (data at sampling times $t_0$ to $t_{1023}$) output from the AD converter 26, and performs the fast Fourier transform. By means of this FFT calculation, if the sampling period is Δt, then a spectrum is obtained with N/2 (=512) points at frequency intervals Δf (=1/Δt·N). The SNR calculation portion 43 uses the spectrum output from the FFT calculation portion 42 to calculate the SNR. That is, the spectrum for the frequency band of the transmission signal channel is summed and the power Ps of the signal component is calculated, and in addition the spectrum not belonging to the transmission signal channel is summed to calculate the noise signal power Pn, and the equation $$SNR = P_s/P_n \tag{10}$$

is used to compute the SNR. The delay amount adjustment portion 44 compares the current SNR with the previous SNR saved in memory 45, and based on the comparison result increases or decreases the clock phase; this clock phase adjustment processing is repeated to determine the optimum clock phase, which is input to the AD converter 26.

(c) Clock Phase Determination Processing

Figure 19:
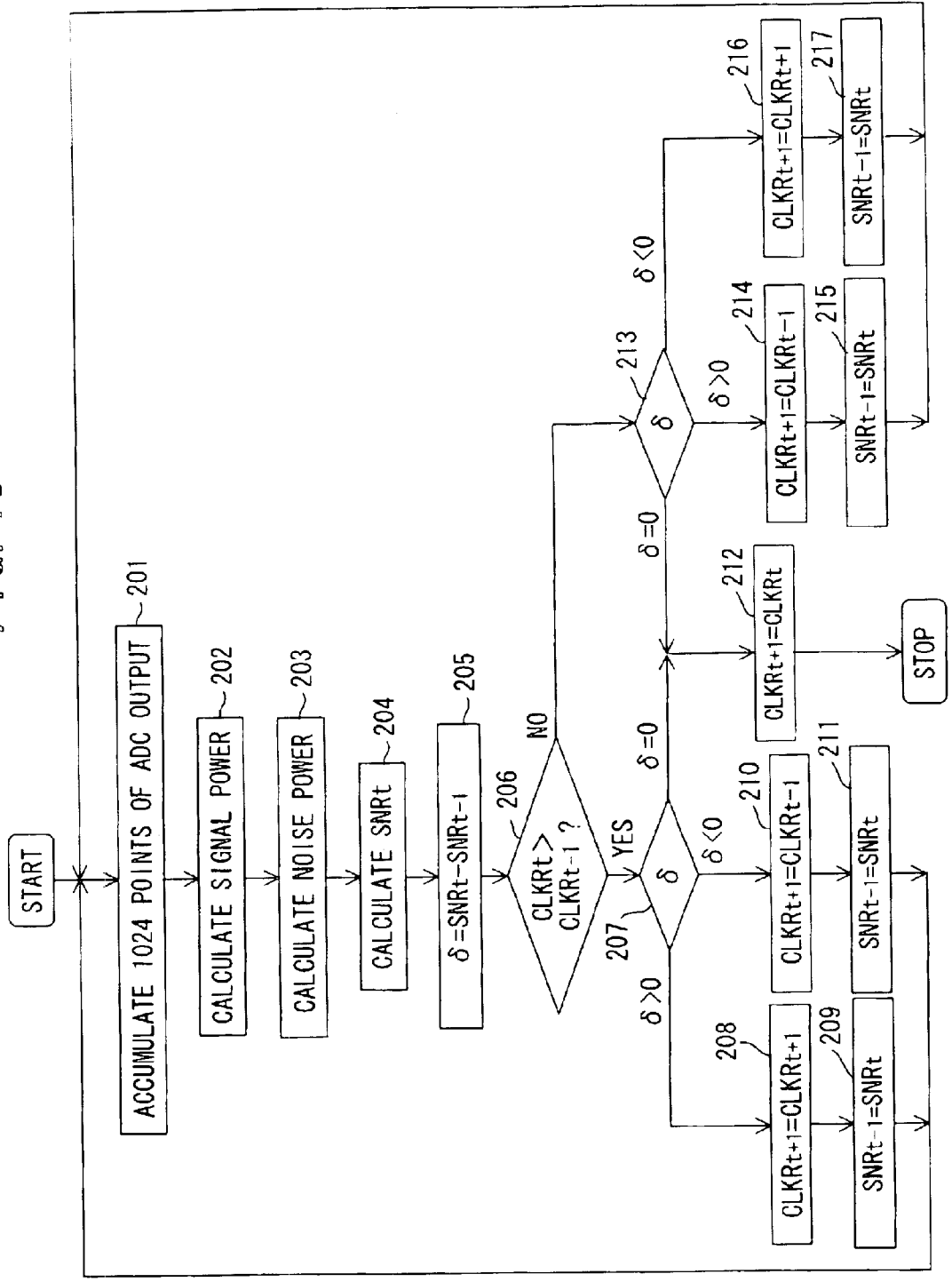
FIG. 19 shows the processing flow to determine the clock phase in the third embodiment.

FIG. 19 shows the flow of clock phase determination processing of the timing adjustment portion 41 in the third embodiment.

The 1024 points of feedback signals output from the AD converter 26 are accumulated (step 201), and FFT calculations are used to calculate the spectrum at prescribed frequency intervals; this spectrum is used to measure the transmission signal power Ps and noise power Pn (steps 202 and 203), and the current $SNR_t$ is measured using eq. (10) (step 204).

Next, the difference δ between the current $SNR_t$ and the previous $SNR_{t-1}$ is calculated (step 205). Here, when the clock phase at the present time t is taken to be $CLKR_t$, and the clock phase at the previous time t−1 is taken to be $CLKR_{t-1}$, a check is performed to determine whether $CLKR_t > CLKR_{t-1}$ obtains (step 206). If the relation obtains, the sign of δ is judged (step 207).

If δ>0, when the clock phase is increased ($CLKR_t > CLKR_{t-1}$), the SNR increases and so is improved. In this case, the clock phase $CLKR_t$ is increased by 1 and taken to be $CLKR_{t+1}$, and the clock phase $CLKR_{t+1}$ is set in the delay element 65 (step 208). By this means, the delay element 65 increases the clock phase by ΔD. Then the current $CLKR_t$ is taken to be $CLKR_{t-1}$ ($CLKR_{t-1}=CLKR_t$, step 209), processing returns to the beginning and the subsequent processing is repeated.

In step 208, if δ<0, when the clock phase is increased ($CLKR_t > CLKR_{t-1}$), the SNR is decreased and so is degraded. In this case, the clock phase $CLKR_t$ is decreased by 1 and taken to be $CLKR_{t+1}$, and this clock phase $CLKR_{t+1}$ is set in the delay element 65 (step 210). By this means, the delay element 65 decreases the clock phase by ΔD. Then, the current $CLKR_t$ is taken to be $CLKR_{t-1}$ ($CLKR_{t-1}=CLKR_t$, step 211), processing returns to the beginning and the subsequent processing is repeated.

If in step 207 δ=0, then the SNR cannot be further improved, and so the next clock phase $CLKR_{t+1}$ is taken to be the current clock phase $CLKR_t$ (step 212), and clock phase adjustment processing ends.

On the other hand, if in step 206 the relation $CLKR_t < CLKR_{t-1}$ not true and $CLKR_t > CLKR_{t-1}$ is true, then the sign of δ is judged (step 213). If δ>0, then when the clock phase is decreased the SNR increases and is improved. In this case, the clock phase $CLKR_t$ is reduced by 1 and taken to be $CLKR_{t+1}$, and this clock phase $CLKR_{t+1}$ is set in the delay element 65 (step 214). By this means, the delay element 65 reduces the clock phase by ΔD. Then, the current $CLKR_t$ is taken to be $CLKR_{t-1}$ ($CLKR_{t-1}=CLKR_t$, step 215), processing returns to the beginning, and the subsequent processing is repeated.

If in step 213 δ<0, that is, when the delay time is decreased the SNR decreases and so is degraded, then the clock phase $CLKR_t$ is incremented by 1 and is taken to be $CLKR_{t+1}$ (step 216). Then, the current $CLKR_t$ is taken to be $CLKR_{t-1}$ ($CLKR_{t-1}=CLKR_t$, step 217), processing returns to the beginning, and subsequent processing is repeated.

If in step 213 δ=0, then the SNR cannot be further improved, and so the next clock phase $CLKR_{t+1}$ is taken to be the current clock phase $CLKR_t$ (step 212), and clock phase adjustment processing ends.

To summarize the above, if $CLKR_t > CLKR_{t-1}$, then the following relations are used:

$$\text{if } SNR_t > SNR_{t-1} \text{ then } CLKR_{t+1} > CLKR_t \tag{11a}$$

$$\text{if } SNR_t = SNR_{t-1} \text{ then } CLKR_{t+1} = CLKR_t \tag{12a}$$

$$\text{if } SNR_t < SNR_{t-1} \text{ then } CLKR_{t+1} < CLKR_t \tag{13a}$$

And if $CLKR_t < CLKR_{t-1}$, the following relations are used:

$$\text{if } SNR_t > SNR_{t-1} \text{ then } CLKR_{t+1} < CLKR_t \tag{11b}$$

$$\text{if } SNR_t = SNR_{t-1} \text{ then } CLKR_{t+1} = CLKR_t \tag{12b}$$

$$\text{if } SNR_t < SNR_{t-1} \text{ then } CLKR_{t+1} > CLKR_t \tag{13b}$$

If this operation is repeated, ultimately the state of eqs. (12a) and (12b) is entered, and the optimum delay amount CLKRopt for which the SNR is best can be determined. If this value is set in the AD converter 26 and distortion compensation processing executed, distortion is decreased. By this means, the power added efficiency of the amplifier can be improved, and reduction of the power consumption is possible. Also, by improving the power added efficiency it is possible to reduce heat generation and curtail heat generation remedies, as a result of which the device scale can be reduced.

The first through fifth modification examples of the first embodiment can be applied similarly to the third embodiment.

(E) Fourth Embodiment

Figure 20:
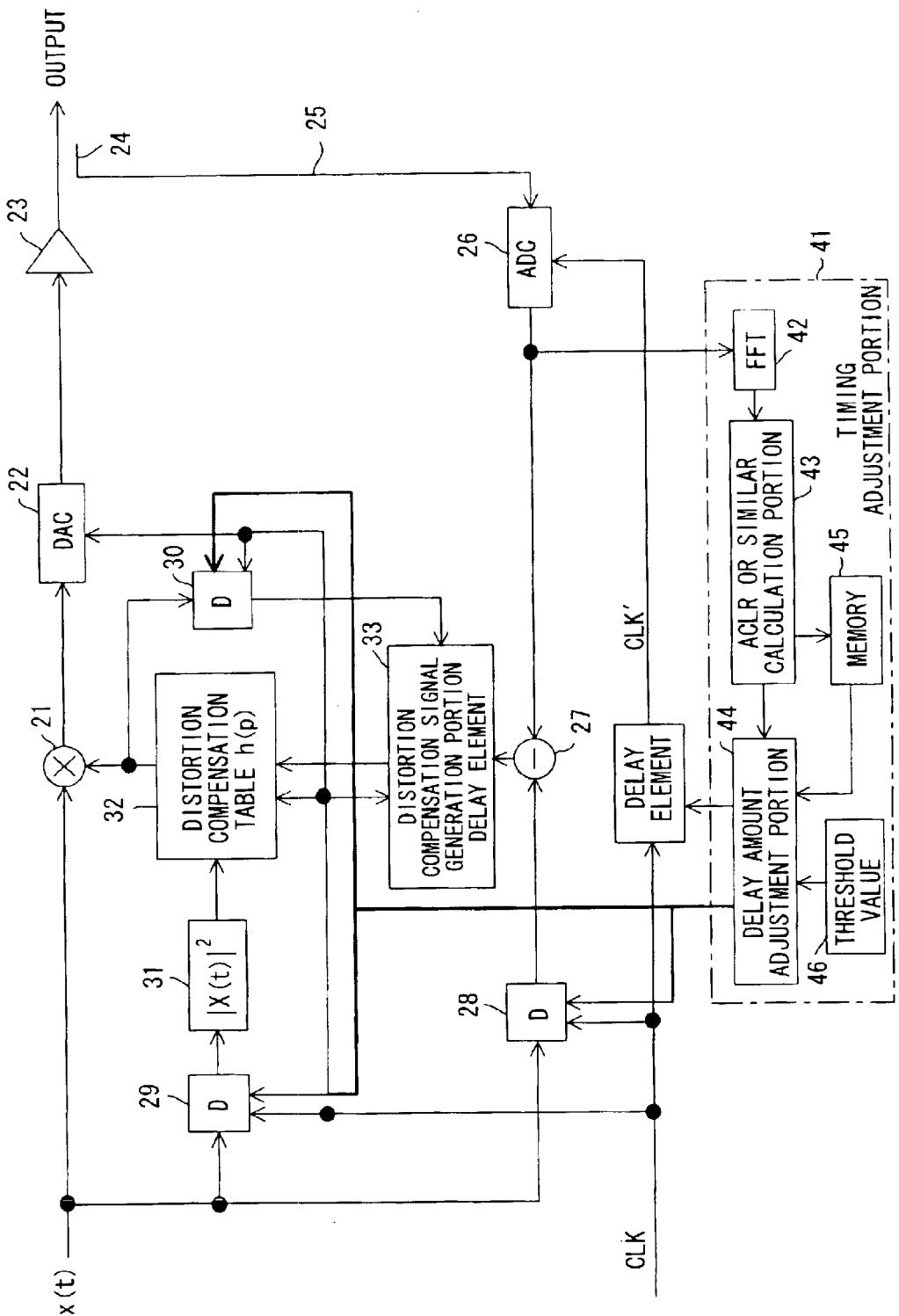
FIG. 20 is a drawing of the configuration of the distortion compensation device of a fourth embodiment.

FIG. 20 shows the configuration of the distortion compensation device of the fourth embodiment, which combines the first and third embodiments to perform high-precision delay time control; the device has a configuration which combines the first embodiment (second modification example) of FIG. 7 and the third embodiment of FIG. 18, and the same portions are assigned the same symbols.

In the delay time determination control of the first embodiment, the determined delay time is set in the delay portions 28 to 30. However, the delay portions 28 to 30 comprise shift registers or similar, and delay times shorter than the clock period cannot be set. On the other hand, in the clock phase determination control of the second embodiment, clock phase control in amounts less than the clock period can be performed, but clock phase control in amounts greater than or equal to the clock period is not possible. Hence in the fourth embodiment, the first and third embodiments are combined to perform high-precision delay time control.

Figure 21:
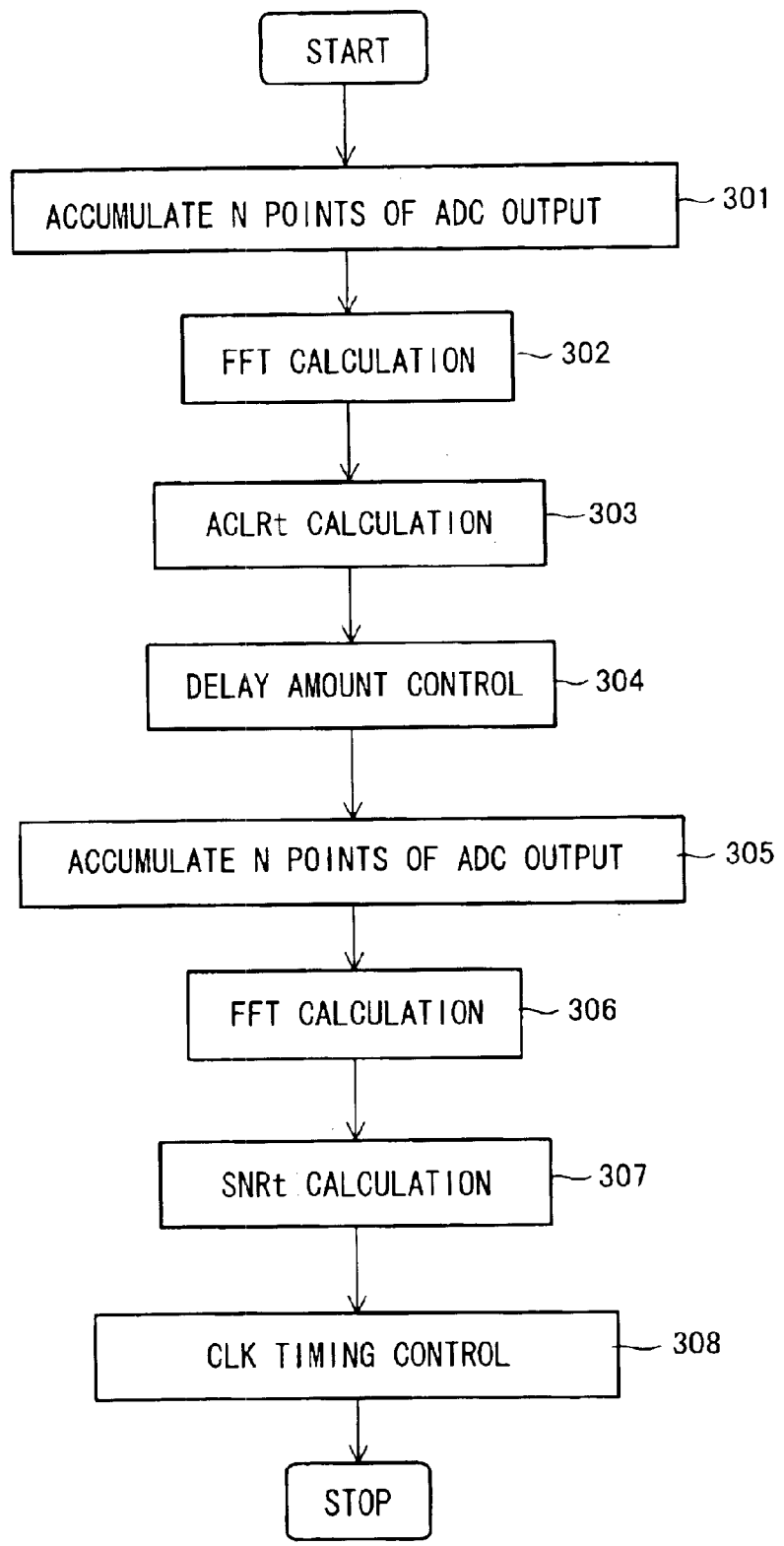
FIG. 21 shows the processing flow in the fourth embodiment.

FIG. 21 shows the processing flow of the fourth embodiment; first the delay time is determined by the method of the first embodiment and set in the delay portions 28 to 30, and then the clock phase is determined according to the third embodiment.

In other words, the feedback signals for 1024 points output from the AD converter 26 are accumulated (step 301), and FFT calculations are used to determine the spectrum at prescribed frequency intervals; this spectrum is used to measure the transmission signal power Ps and adjacent channel power P11, and eq. (1) is used to measure the current $ACLR_t$. Then, the difference δ between the current $ACLR_t$ and the previous $ACLR_{t-1}$ is calculated (steps 302, 303).

Thereafter, the delay time is increased or decreased until the difference δ between the current $ACLR_t$ and the previous $ACLR_{t-1}$ is equal to or less than a first setting, to determine the total delay time for the transmission power amplifier and the feedback loop, and this delay time is set in the delay portions 28 to 30 (step 304).

Next, the feedback signals for 1024 points output from the AD converter 26 are accumulated (step 305), FFT calculations are performed to determine the spectrum at prescribed frequency intervals, this spectrum is used to measure the transmission signal power Ps and noise power Pn, and eq. (10) is used to measure the current SNRt. Then, the difference δ between the current $SNR_t$ and the previous $SNR_{t-1}$ is calculated (steps 306, 307).

Thereafter, the phase of the clock CLK' is increased or decreased until the difference δ between the current $SNR_t$ and the previous $SNR_{t-1}$ is equal to or less than a second setting, and the result is input to the AD converter 26 (step 308).

Thus by means of the fourth embodiment, delay time control can be performed in units smaller than the clock period. Hence feedback signal delay amounts other than in CLK units can be accommodated. For example, a delay time of n clock periods can be set in the delay portions 28 to 30, and a phase delay of ¼ clock period, shorter than the clock period, can be set in the AD converter 26.

By means of the above, the precision of distortion compensation can be increased and the power added efficiency of the amplifier can be improved, so that reduction of power consumption is possible. And by improving the power added efficiency, heat generation can be decreased, and heat generation remedies can be curtailed; consequently the device scale can be reduced.

In the above explanation, control of the delay amount is performed first, but the clock timing may be performed first instead.

(F) Fifth Embodiment

In the first embodiment, by subjecting an AD-converted feedback signal to FFT calculations, the ACLR, SNR or ENOB is calculated, and delay time determination control is performed; in the fifth embodiment, the noise power is calculated without using FFT calculations, and the delay time is determined such that the noise power is minimum.

Figure 22:
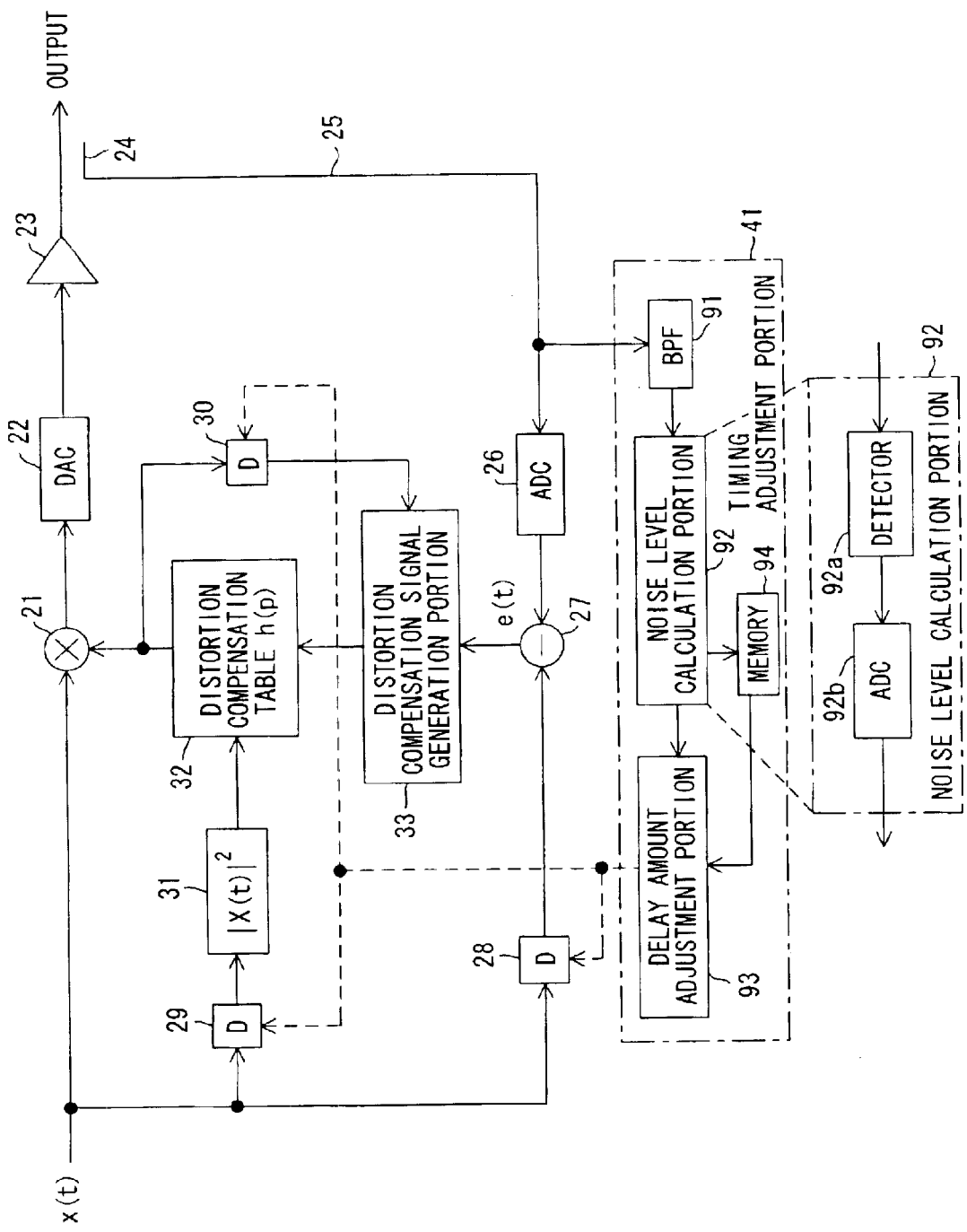
FIG. 22 is a drawing of the configuration of the distortion compensation device of a fifth embodiment.

FIG. 22 shows the configuration of the distortion compensation device of the fifth embodiment; portions which are the same as in the first embodiment of FIG. 3 are assigned the same symbols. A difference with the first embodiment is the configuration of the timing adjustment portion 41.

In the timing adjustment portion 41, the band-pass filter 91 is provided with the band pass characteristic shown in (b) of FIG. 23, so that only the adjacent channel frequency band components (see the shaded portion in (a) of FIG. 23) contained in the feedback signal are passed, and the noise level calculation portion 92 detects the noise power Pn from the band-pass filter output and both inputs the result to the delay amount adjustment portion 93, and also stores the result in memory 94. That is, in the noise level calculation portion 92, the noise power Pn is detected by the detector 92a, and after conversion into digital form by the AD converter 92b is input to the delay amount adjustment portion 93. Similarly to the processing flow of FIG. 4, the delay amount adjustment portion 93 increases or decreases the delay time $D_t$ such that the difference δ between the current noise power $Pn_t$ and the previous noise power $Pn_{t-1}$ is zero or is equal to or less than a threshold value, and also sets the delay time in the delay portions 28 to 30. Thereafter, by repeating this control, the total delay time of the transmission power amplifier 23 and feedback loop is ultimately obtained, and is set in the delay portions 28 to 30.

Figure 24:
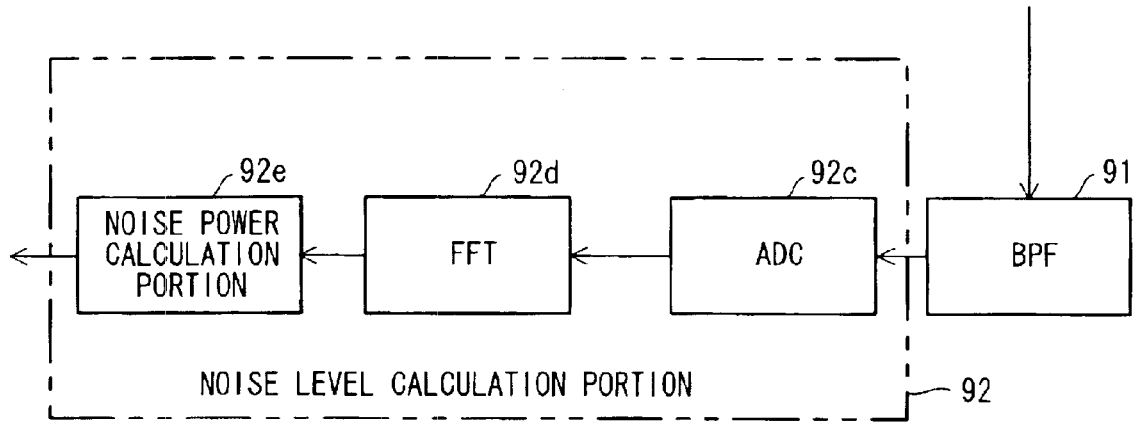
FIG. 24 is a drawing of another configuration of a noise level calculation portion.

As shown in FIG. 24, the noise level calculation portion 92 may employ the AD converter 92c for A/D conversion of the adjacent channel signal components input from the band-pass filter 91, employ the FFT calculation portion 92d for FFT calculation of the AD-converted output, and employ the noise power calculation portion 92e to calculate the noise power using the FFT output.

Figure 25:
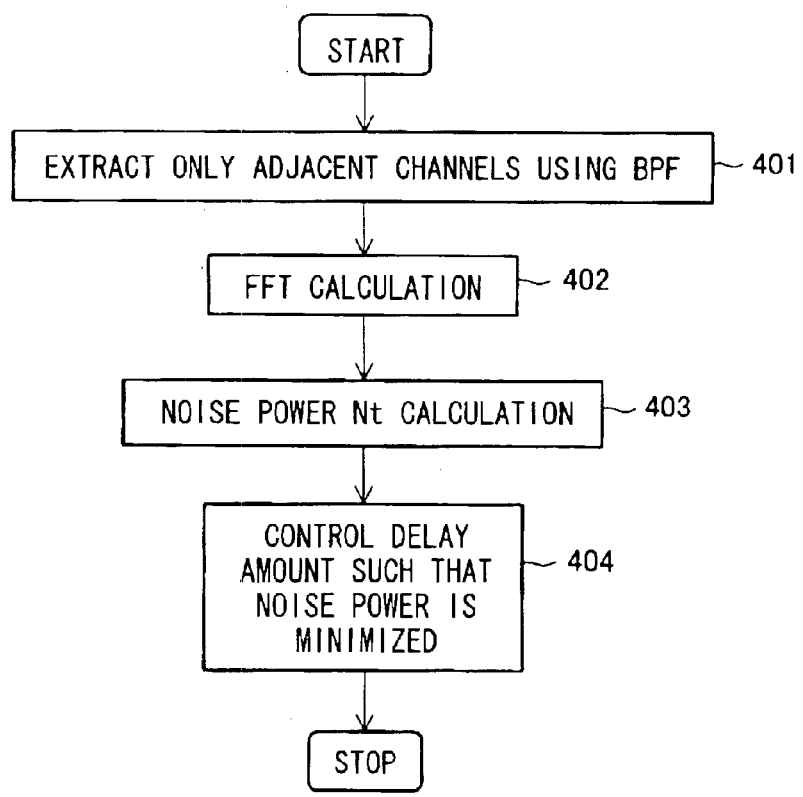
FIG. 25 shows the processing flow of noise power calculation.
Figure 28:
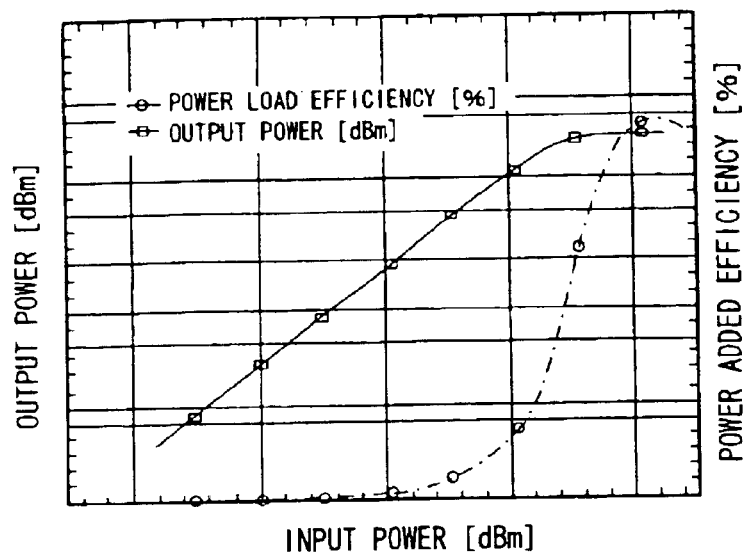
FIG. 28 shows an example of the efficiency characteristic of a power amplifier.
Figure 29:
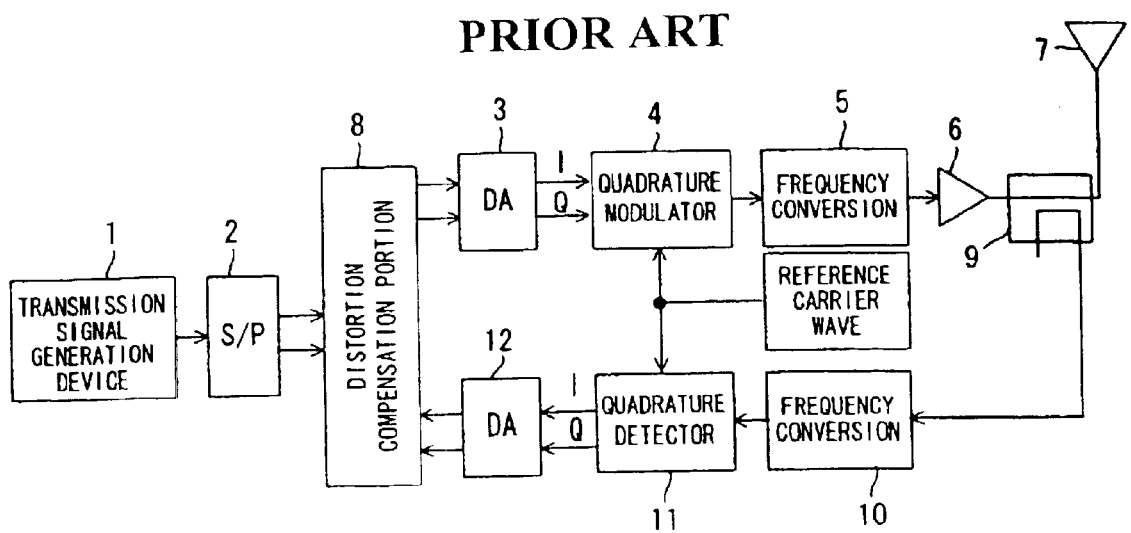
FIG. 29 is a drawing showing the configuration of a transmission device comprising a conventional digital non-linear distortion compensation function.
Figure 30:
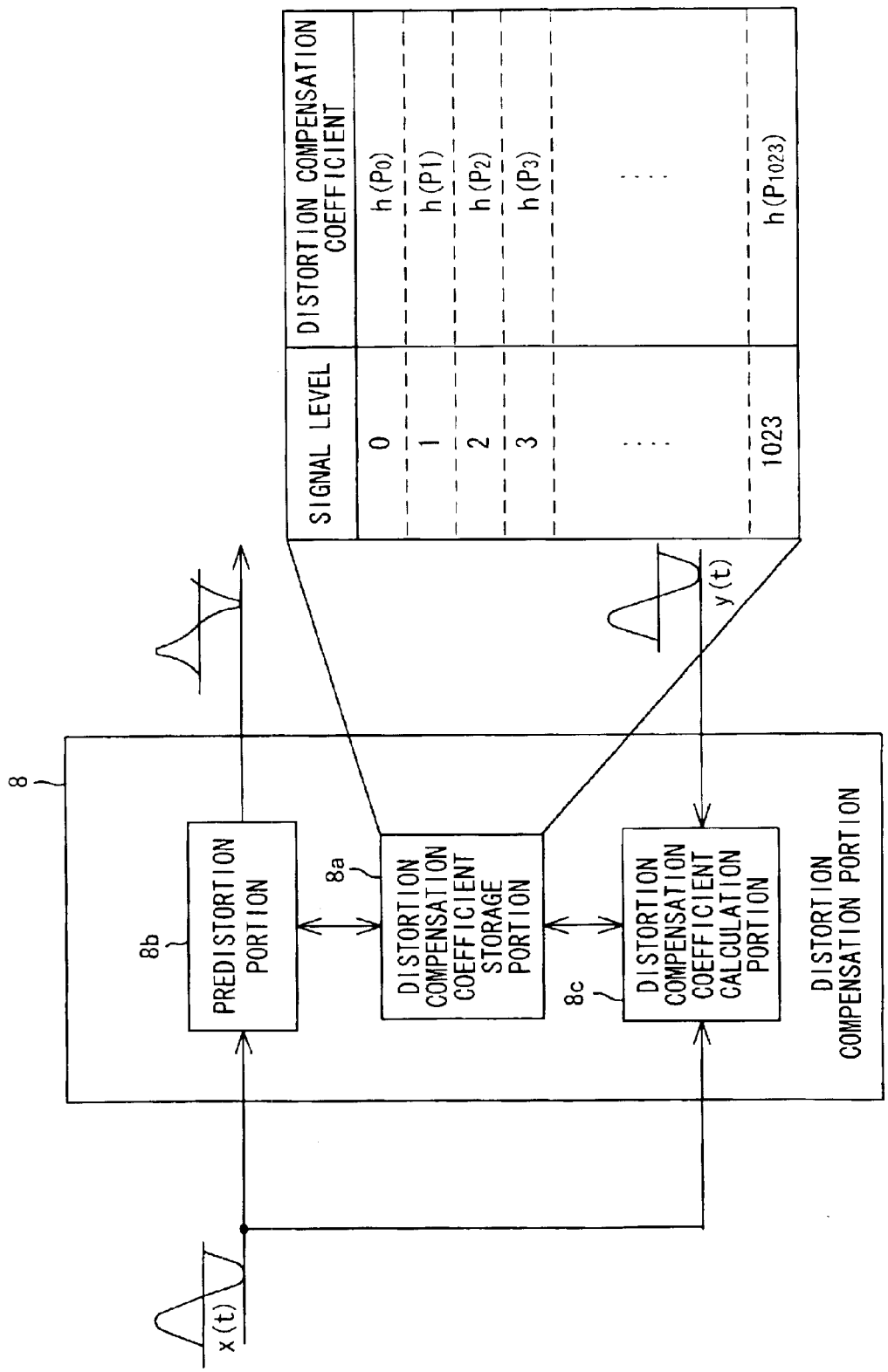
FIG. 30 is a drawing of the functional configuration of a distortion compensation portion.

FIG. 25 shows the flow of delay time determination control using the configuration of FIG. 24 as the noise level calculation portion 92; the adjacent channel signal components are extracted using the band-pass filter 91 (step 401), the adjacent channel signal components are subjected to FFT processing (step 402), the FFT output is used to calculate the noise power (step 403), and the delay time is adjusted such that the noise power is minimum (step 404).

The second through fifth modification examples explained in the first embodiment can be applied to the fifth embodiment.

By means of the above-described invention, the timing of the transmission signal and feedback signal in a distortion compensation device can be automatically adjusted with good precision, and by this means the distortion compensation precision can be improved, and distortion compensation can be performed with stability.

Also, by means of this invention the power added efficiency of the transmission power amplifier can be improved, enabling reduction of power consumption. Also, through the improvement in the power added efficiency, the amount of heat generated can be reduced, heat generation remedies can be curtailed, and the scale of the device can be reduced.

What is claimed is:

1. distortion compensation device, which uses distortion compensation coefficients to subject distortion compensation processing to an input signal and supply the result of the distortion compensation processing to a distorting device, calculates the distortion compensation coefficients based on the input signal before distortion compensation and on the feedback signal fed back from the output side of the distorting device, and stores the calculated distortion compensation coefficients in association with the input signal, comprising:

an AD conversion portion, which AD-converts said feedback signal;

an FFT calculation portion, which performs fast Fourier transform processing of the output of the AD conversion portion, to calculate a spectrum;

a calculation portion, which, based on the FET calculation results, calculates either the signal-to-noise ratio SNR, or the adjacent channel leakage power ratio ACLR, or the noise level Pn, or the effective number of bits ENOB;

a delay time determination portion, which compares said calculated value at the current time and said calculated value at the immediately preceding time, and based on the comparison result, delay time of the signal generated in the distorting device and the feedback loop, and repeats the delay time determination processing to determine said delay time; and, a delay circuit, in which said delay time is set, and which performs timing adjustment of each of the portions of the distortion compensation device.

2. The distortion compensation device according to claim 1, further comprising a signal synthesis portion which frequency-multiplexes a plurality of transmission signals to generate said input signal.

3. The distortion compensation device according to claim 1, wherein, when the difference in said calculated values is equal to or lower than a set value, said delay time determination portion ends the delay time determination processing.

4. The distortion compensation device according to claim 3, wherein said delay time determination portion comprises a timer, and performs the delay time determination processing intermittently.

5. The distortion compensation device according to claim 3, wherein, as the difference between said calculated values decreases, said FFT calculation portion increases the number of AD-converted data items for which FFT calculations are performed.

6. The distortion compensation device according to claim 3, comprising a switch to select and supply the output signal of the distorting device to the AD conversion portion when determining the delay time.

7. A distortion compensation device, which uses distortion compensation coefficients to subject distortion compensation processing to an input signal and supply the result of the distortion compensation processing to a distorting device, calculates the distortion compensation coefficients based on the input signal before distortion compensation and on the feedback signal fed back from the output side of the distorting device, and stores the calculated distortion compensation coefficients in association with the input signal, comprising:

an AD conversion portion, which AD-converts the feedback signal;

an FFT calculation portion, which performs fast Fourier transform processing of the output of the AD conversion portion, to calculate a spectrum;

a calculation portion, which, based on the FFT calculation results, calculates either the signal-to-noise ratio SNR, or the adjacent channel leakage power ratio ACLR, or the noise level Pn, or the effective number of bits ENOB; and, a clock timing adjustment portion, which compares said calculated value at the current time and said calculated value at the immediately preceding time, and based on the comparison result, adjusts the clock timing of the AD conversion portion.

8. The distortion compensation device according to claim 7, having a signal synthesis portion which frequency-multiplexes a plurality of transmission signals to generate said input signal.

9. The distortion compensation device according to claim 7, wherein said clock timing adjustment portion ends clock timing adjustment when the difference between said calculated values becomes equal to or less than a set value.

10. The distortion compensation device according to claim 9, wherein said clock timing adjustment portion comprises a timer, and performs clock timing adjustment processing intermittently.

11. The distortion compensation device according to claim 9, further comprising a switch which selects and supply the output signal of the distorting device to the AD conversion portion during clock timing adjustment.

12. The distortion compensation device according to claim 7, further comprising:

a delay time determination portion which adjusts the delay time of the signal occurring in the distorting device and feedback loop based on said comparison result and, by repeating the adjustment processing, determines said delay time; and a delay circuit, in which said delay time is set and which performs timing adjustment of each of the portions of the distortion compensation device, wherein when the difference between said calculated values becomes equal to or less than a first set value, said delay time determination portion ends delay time determination control, and when the difference between said calculated values becomes equal to or less than a second set value, said clock timing adjustment portion ends clock timing adjustment.

13. A distortion compensation device, which uses distortion compensation coefficients to subject distortion compensation processing to an input signal and supply the result of the distortion compensation processing to a distorting device, calculates the distortion compensation coefficients based on the input signal before distortion compensation and on the feedback signal fed back from the output side of the distorting device, and stores the distortion compensation coefficients in association with the input signal, comprising:

a band-pass filter, the pass band of which is at least the frequency bands of adjacent channels, and to which is input said feedback signal;

a noise power detection portion, which detects the noise power including the power of adjacent channels from the output of the band-pass filter;

a delay time determination portion, which compares said noise power at the current time with the noise power at the immediately preceding time, determines the delay time of the signal occurring in the distorting device and feedback loop based on the comparison result, and repeats the delay time determination processing to determine said delay time; and, a delay circuit, in which is set said delay time, and which performs timing adjustment in each of the portions of the distortion compensation device.

14. The distortion compensation device according to claim 13, further comprising a signal synthesis portion which frequency-multiplexes a plurality of transmission signals to generate said input signal.

15. The distortion compensation device according to claim 13, wherein said delay time determination portion ends the delay time determination processing when the difference between said calculated values becomes equal to or less than a set value.

16. The distortion compensation device according to claim 13, wherein said delay time determination portion comprises a timer, and performs the delay time determination processing intermittently.

17. The distortion compensation device according to claim 13, further comprising a switch to select and supply the output signal of the distorting device to the AD conversion portion when adjusting the delay time.

* * * * *